United States Patent [19]

Phillips

[11] Patent Number: 4,897,541

[45] Date of Patent: Jan. 30, 1990

[54] SENSORS FOR DETECTING ELECTROMAGNETIC PARAMETERS UTILIZING RESONATING ELEMENTS

[75] Inventor: Stephen R. Phillips, Walnut Creek, Calif.

[73] Assignee: Luxtron Corporation, Mountain View, Calif.

[21] Appl. No.: 201,599

[22] Filed: Jun. 2, 1988

Related U.S. Application Data

[60] Continuation-in-part of Ser. No. 64,345, Jun. 19, 1987, abandoned, which is a division of Ser. No. 612,060, May 18, 1984, Pat. No. 4,678,905.

[51] Int. Cl.⁴ .......................... G01D 5/34; G01L 9/00
[52] U.S. Cl. ................................. 250/227; 250/231 P
[58] Field of Search ............... 250/227, 231 R, 231 P, 250/237 G; 324/96; 332/7.51; 350/355, 356; 374/117; 73/653-657

[56] References Cited

U.S. PATENT DOCUMENTS

| | | | |
|---|---|---|---|
| 3,238,789 | 7/1961 | Erdley | 73/517 R |
| 3,249,105 | 5/1966 | Polanyi | 128/675 |
| 3,561,253 | 2/1971 | Doorman | 73/28 |
| 3,580,082 | 5/1971 | Strack | 73/406 |
| 3,683,213 | 8/1972 | Staudte | 310/312 |
| 3,715,911 | 2/1973 | Chuan | 73/28 |
| 3,808,557 | 4/1974 | Smiley | 73/653 |
| 3,950,987 | 4/1976 | Slezinger et al. | 73/362 R |
| 3,969,640 | 7/1976 | Staudte | 310/312 |
| 3,969,641 | 7/1976 | Oguchi et al. | 310/9.5 |
| 4,111,036 | 9/1978 | Frechette et al. | 73/23 |
| 4,160,600 | 7/1979 | Luke | 73/705 |
| 4,193,010 | 3/1980 | Kompanek | 310/330 |
| 4,210,029 | 7/1980 | Porter | 73/705 |

(List continued on next page.)

FOREIGN PATENT DOCUMENTS

| | | |
|---|---|---|
| 0005798 | 5/1979 | European Pat. Off. . |
| 58-19527 | 7/1981 | Japan . |
| 0207012 | 10/1985 | Japan .................................. 73/653 |
| 2146120 | 4/1985 | United Kingdom ............. 73/862.59 |

OTHER PUBLICATIONS

"Chemical Sensors Based on Fiber Optics", W. Rudolf Seitz, *Analytical Chemistry*, vol. 56, No. 1, Jan. 1984.
"Biosensors: A New Analytical Technology", Pepi Ross, *Bio Techniques*, Nov./Dec. 1983.
"Principles of Optical Fibre Sensors and Instrumentation," A. L. Harmer, *Measurement and Control*, vol. 15, Apr. 1982.
"Tilting-Mirror Fiber-Optic Accelerometer," Richard A. Soref and Donald H. McMahon, *Applied Optics*, vol. 23, No. 3, Feb. 1, 1984.
Ultra Miniature Low Frequency Quartz Crystals and Oscillators, Technical Data & Short Form Catalog, Statek Corporation, Data Sheet F335.
"Force Sensor Using Double-Ended Tuning Fork Quarts Crystals," Shih S. Chuang, Statek Corporation, Orange, CA 1983 IEEE.
"Tuning Fork Resonator Sensors," E. P. Ernisse and R. B. Wiggins, *Sensors*, pp. 6–9, Mar. 1986.
Statek TS-2 Data Sheet.
"Light Light Choppers," Bulova Watch Company, (List continued on next page.)

*Primary Examiner*—David C. Nelms
*Assistant Examiner*—Stephone B. Allen
*Attorney, Agent, or Firm*—Majestic, Parsons, Siebert & Hsue

[57] ABSTRACT

To detect a physical parameter, a resonator is connected to a body which changes in dimension when subjected to the parameter. Thus, when the body changes in dimension in response to the parameter, the resonance frequency of the resonator is modulated thereby. Such modulations are detected optically to detect and measure the parameter. In the preferred embodiment, the resonator transmits light and light is applied to the resonator so that the light supplied is transmitted through the resonator and so that the modulations of the resonance frequency also modulates the intensity of the light transmitted by the resonator. The modulations of the intensity of the light transmitted by the resonator is detected to detect the parameter.

39 Claims, 20 Drawing Sheets

U.S. PATENT DOCUMENTS

| | | | |
|---|---|---|---|
| 4,215,570 | 8/1980 | EerNisse et al. | 73/141 R |
| 4,270,050 | 5/1981 | Brogardh | 250/231 R |
| 4,275,296 | 6/1981 | Adolfsson | 250/227 |
| 4,281,245 | 7/1981 | Brogardh et al. | 250/227 |
| 4,286,468 | 9/1981 | Altman | 73/655 |
| 4,320,475 | 3/1982 | Leclerc et al. | 367/149 |
| 4,322,978 | 4/1982 | Fromm | 73/703 |
| 4,322,979 | 4/1982 | Fromm | 73/705 |
| 4,345,475 | 8/1982 | Bickel | 73/657 |
| 4,345,482 | 8/1982 | Adolfsson et al. | 73/653 |
| 4,353,259 | 10/1982 | Schneider, Jr. | 73/653 |
| 4,362,961 | 12/1982 | Gerber | 310/370 |
| 4,368,645 | 1/1983 | Glenn et al. | 73/705 |
| 4,372,173 | 2/1983 | EerNisse et al. | 73/862.59 |
| 4,376,390 | 3/1983 | Rines | 73/517 |
| 4,377,765 | 3/1983 | Kogure et al. | 310/312 |
| 4,379,226 | 4/1983 | Sichling et al. | 73/653 |
| 4,379,244 | 4/1983 | Dinger et al. | 310/312 |
| 4,382,204 | 5/1983 | Yoda | 310/366 |
| 4,384,232 | 5/1983 | Debely | 310/370 |
| 4,398,115 | 8/1983 | Gagnepain et al. | 310/313 |
| 4,439,705 | 3/1984 | Corbett | 310/338 |
| 4,448,546 | 5/1984 | Paros | 374/117 |
| 4,459,042 | 7/1984 | Paros | 374/117 |
| 4,547,729 | 10/1985 | Adolfsson et al. | 324/96 |
| 4,567,771 | 2/1986 | Nelson et al. | 73/653 |
| 4,572,670 | 2/1986 | Fredrickson | 250/227 |
| 4,678,904 | 7/1987 | Saaski et al. | 250/227 |
| 4,678,905 | 7/1987 | Phillips | 250/227 |

OTHER PUBLICATIONS

Inc., Electronics Division, Reprint from Bulova Watch Co.

"Optical Scanner," by F. Dostal, Optical Spectra—Mar./Apr., 1969.

Bulova-American Time Products Catalog, Light Chopper Type L40 and L42.

"Portable Piezoelectric Crystal Detector for Field Monitoring of Environmental Pollutants, " by Mat H. Ho and George G. Guilbault in *Anal. Chem.*, vol. 55, pp. 1830–1832, 1983.

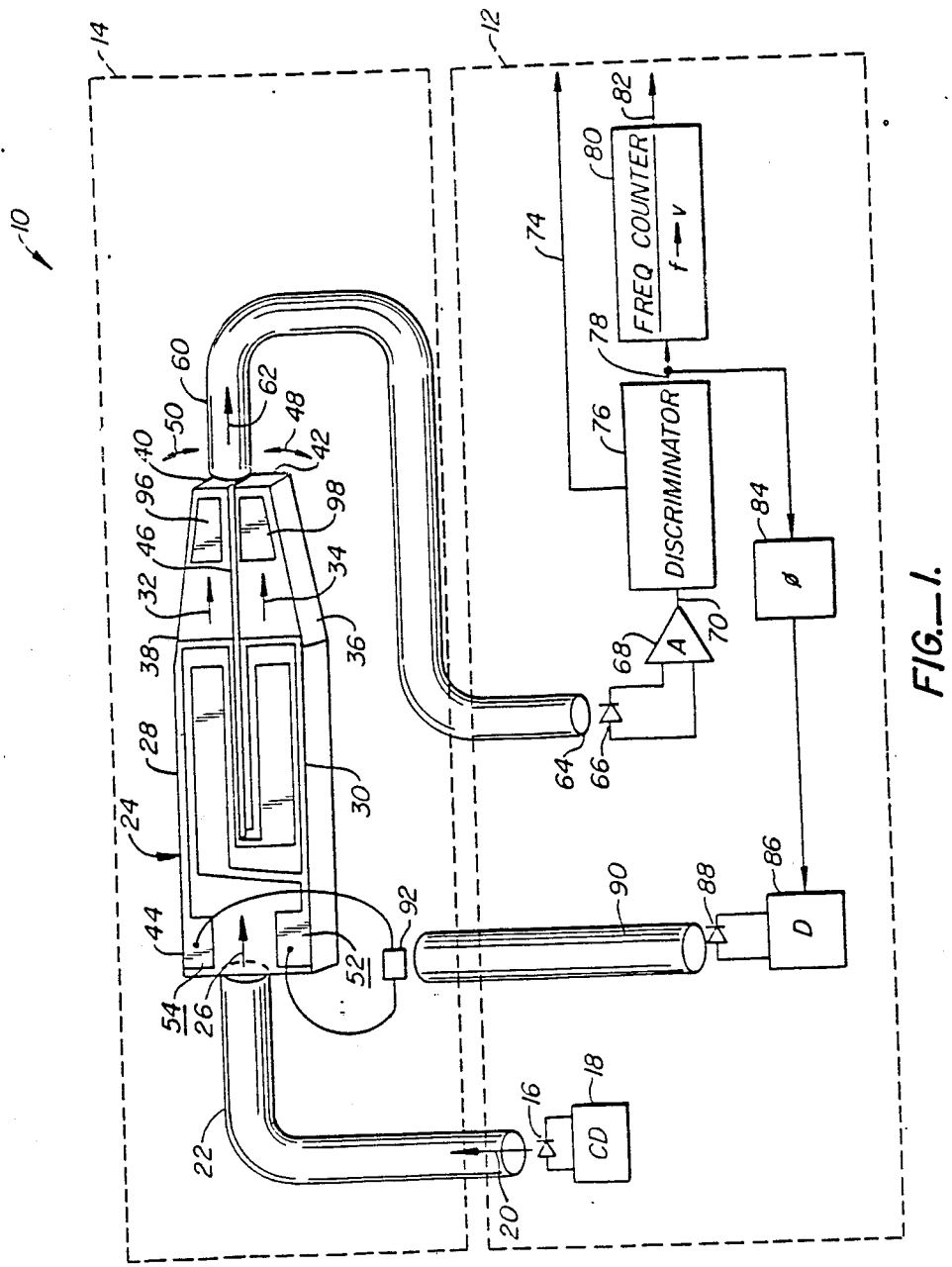
FIG._1.

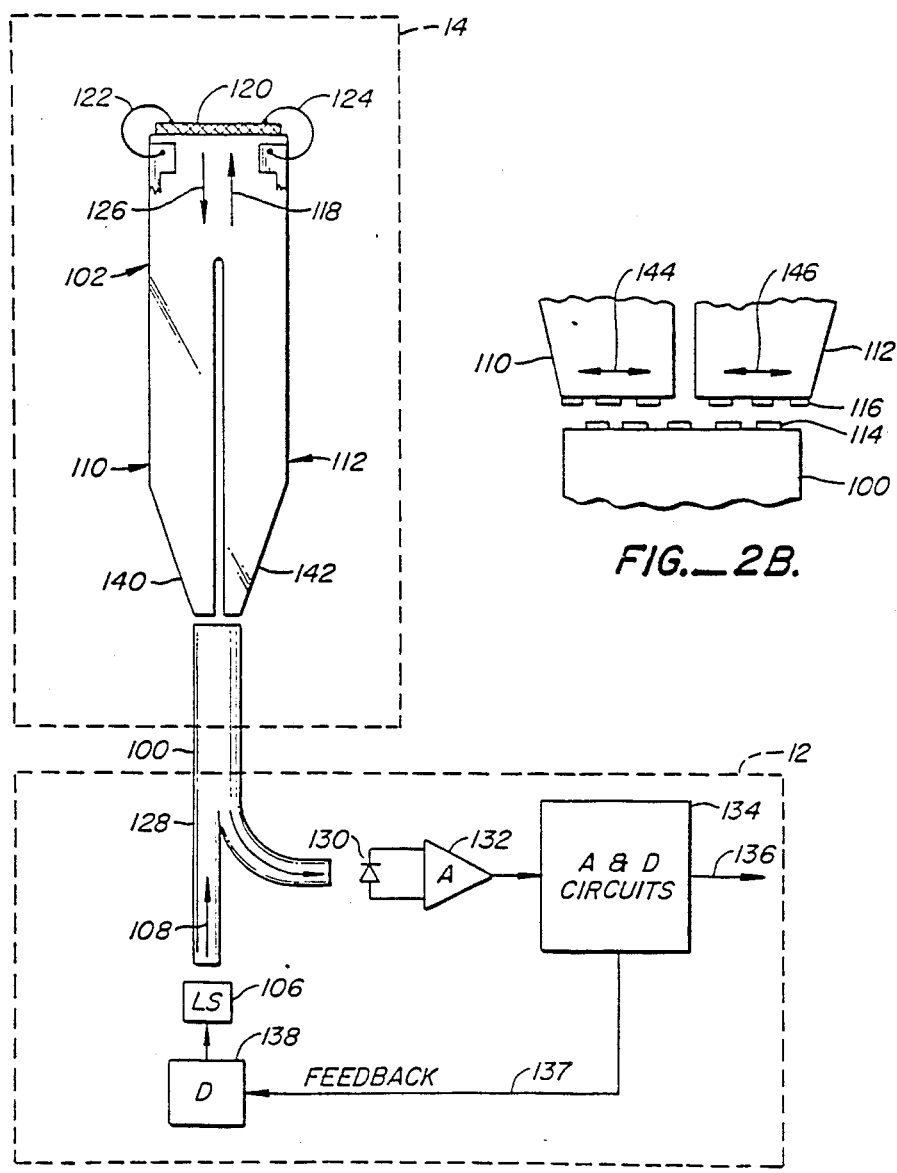
FIG._2B.
FIG._2A.

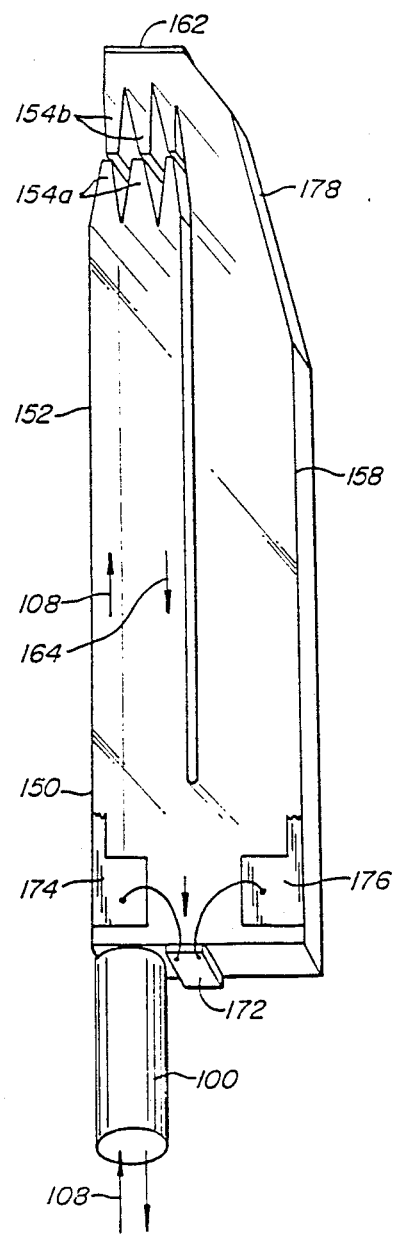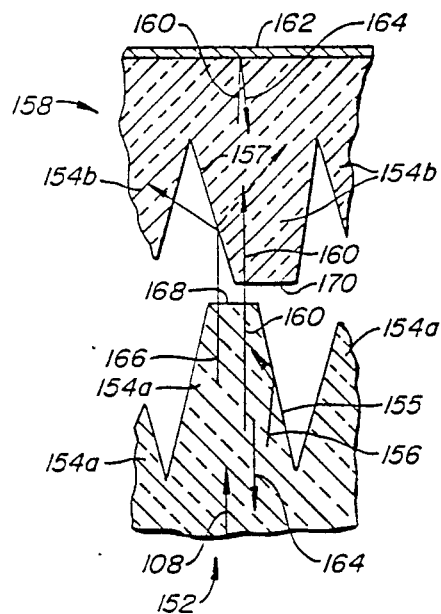
FIG._3A.
FIG._3B.

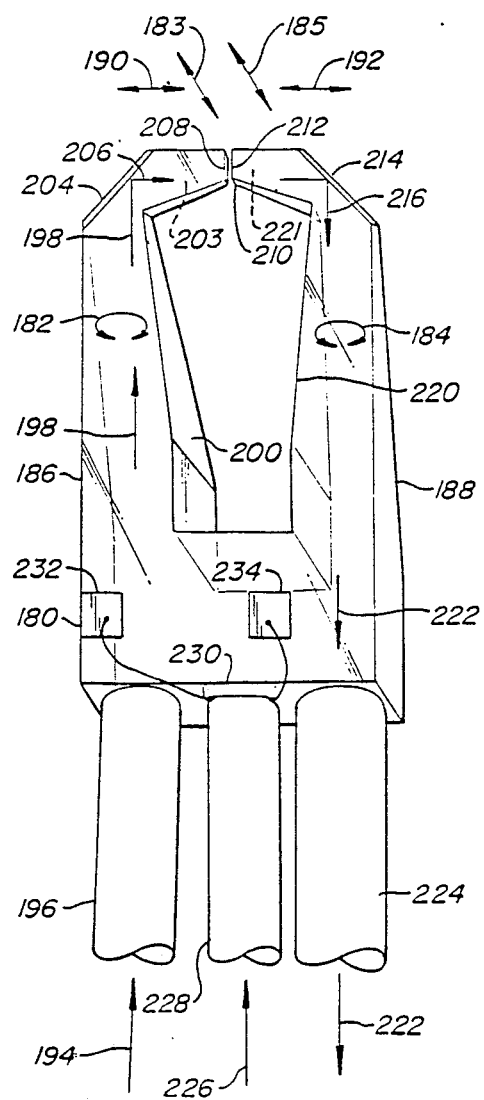
FIG._4.

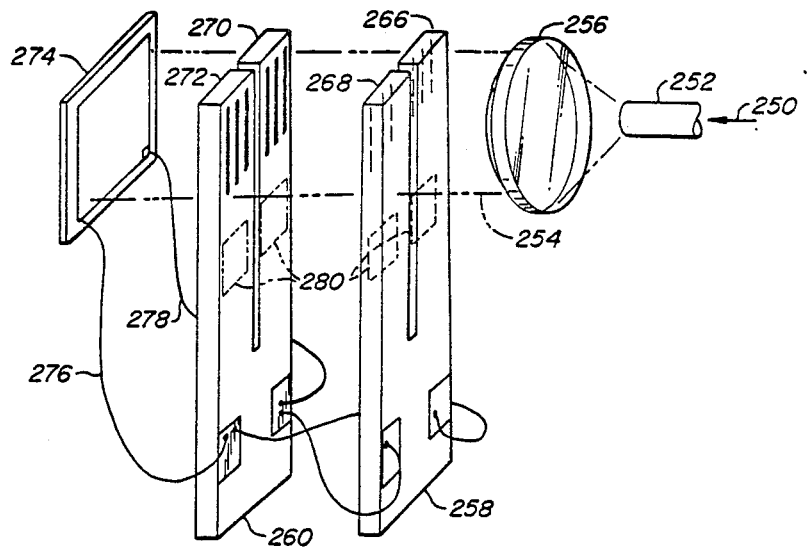
FIG._5A.
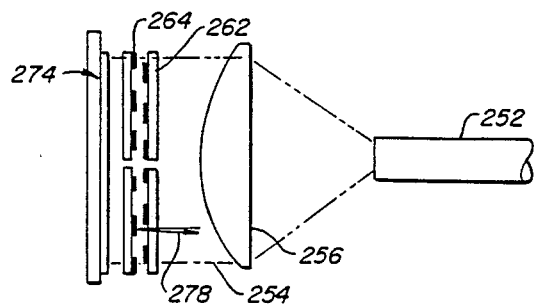
FIG._5B.

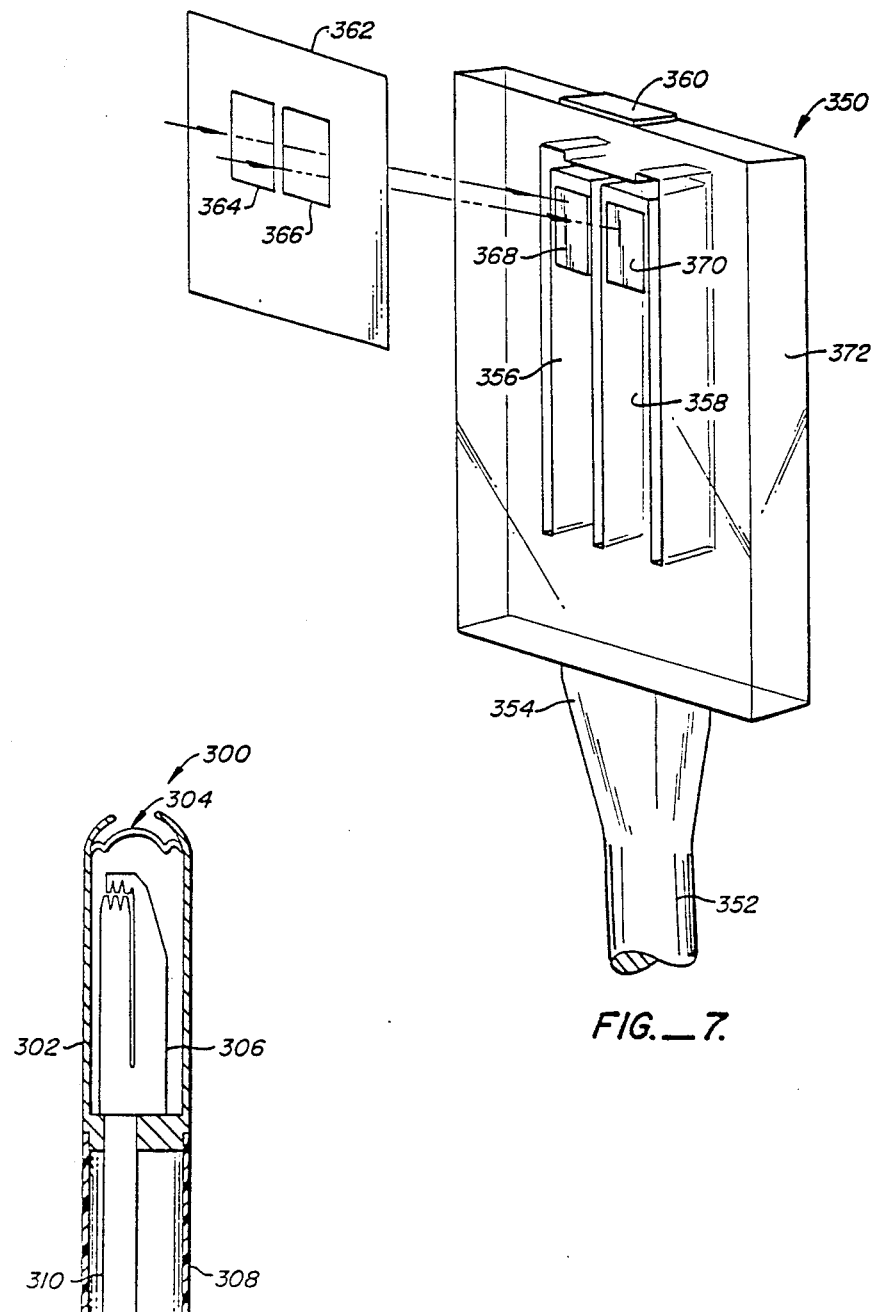

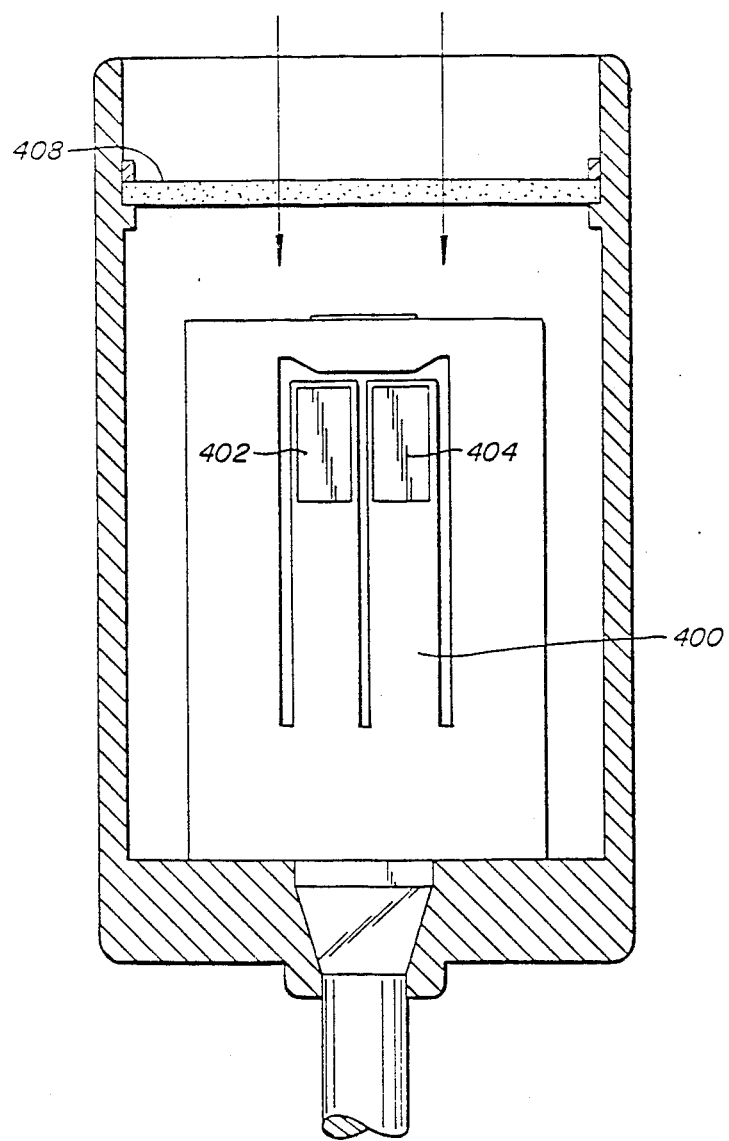
FIG._8A.

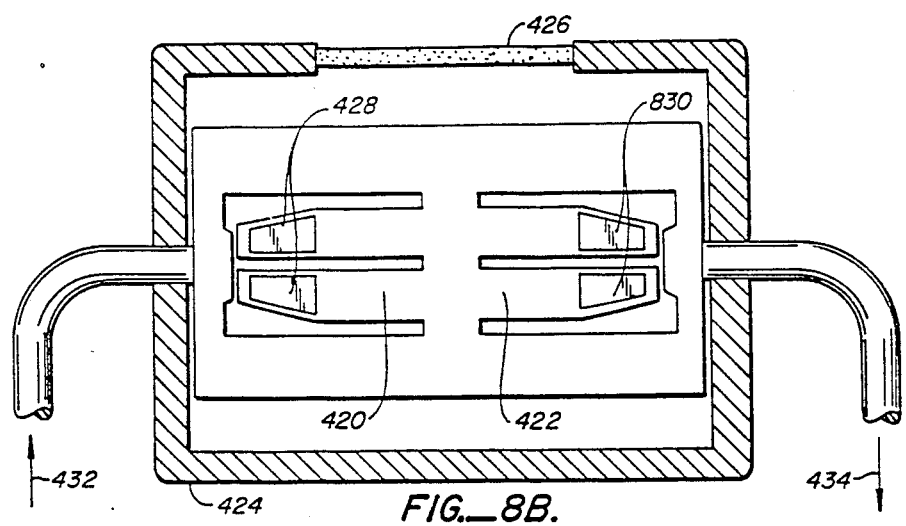
FIG._8B.
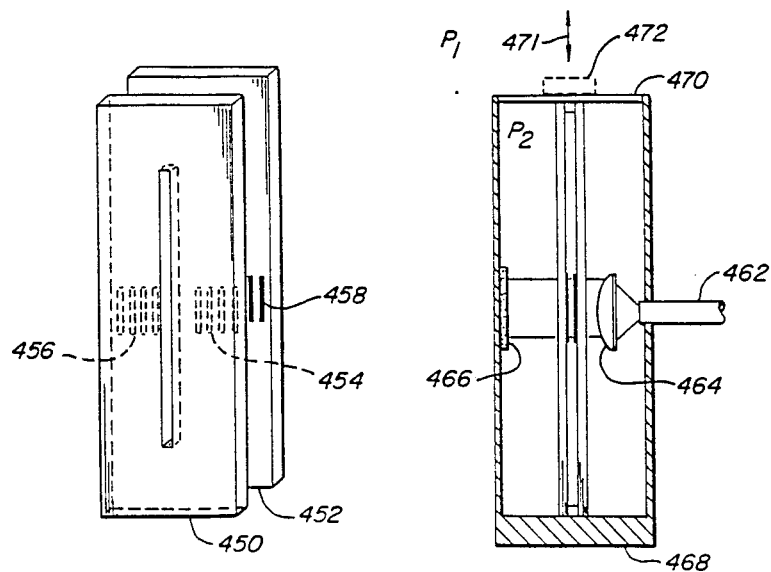
FIG._9A.   FIG._9B.

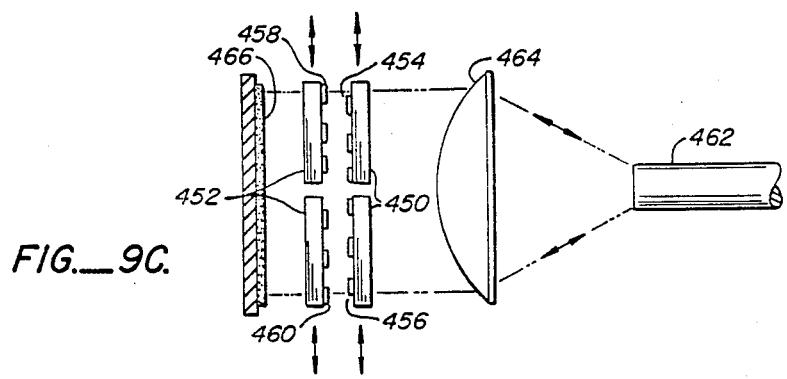
FIG.__9C.
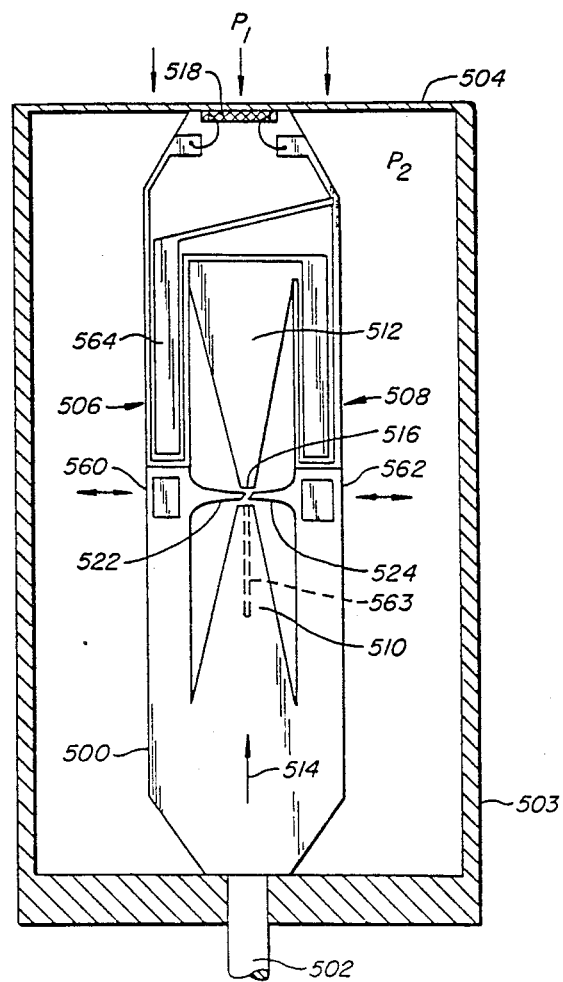
FIG.__10.

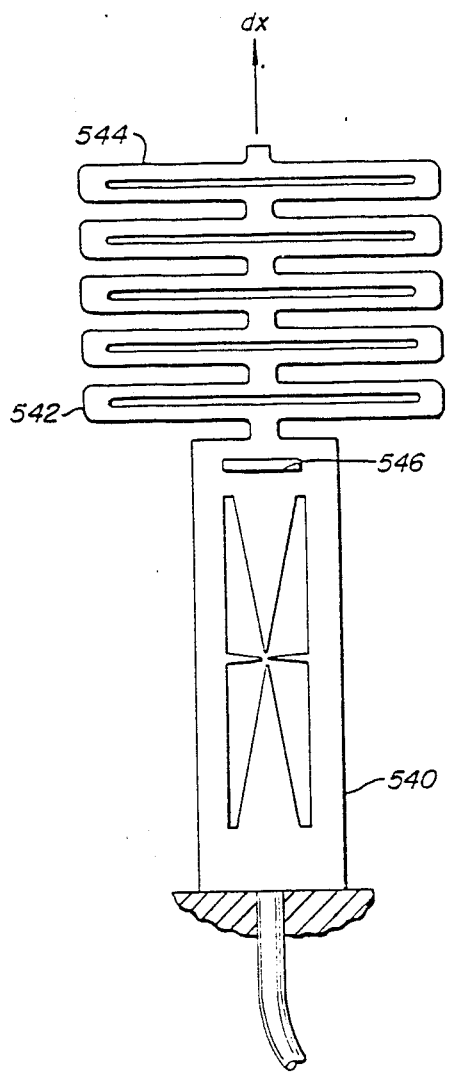
FIG._11.
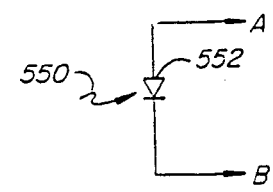
FIG._12A.
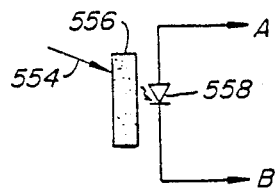
FIG._12B.
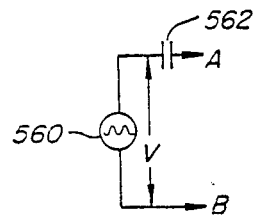
FIG._12C.
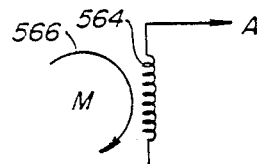
FIG._12D.
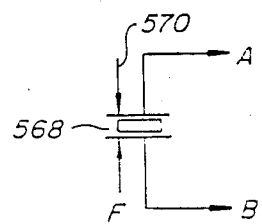
FIG._12E.

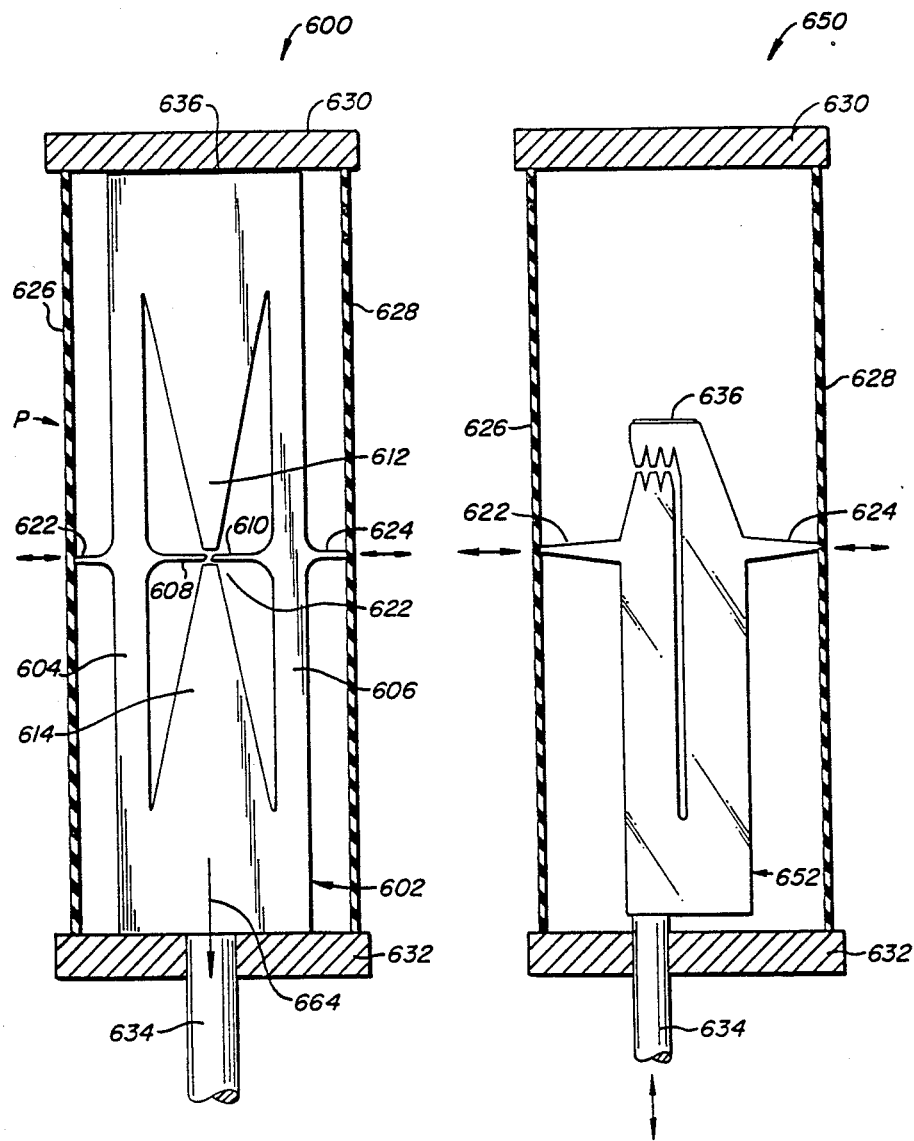
FIG._13A.  FIG._13B.

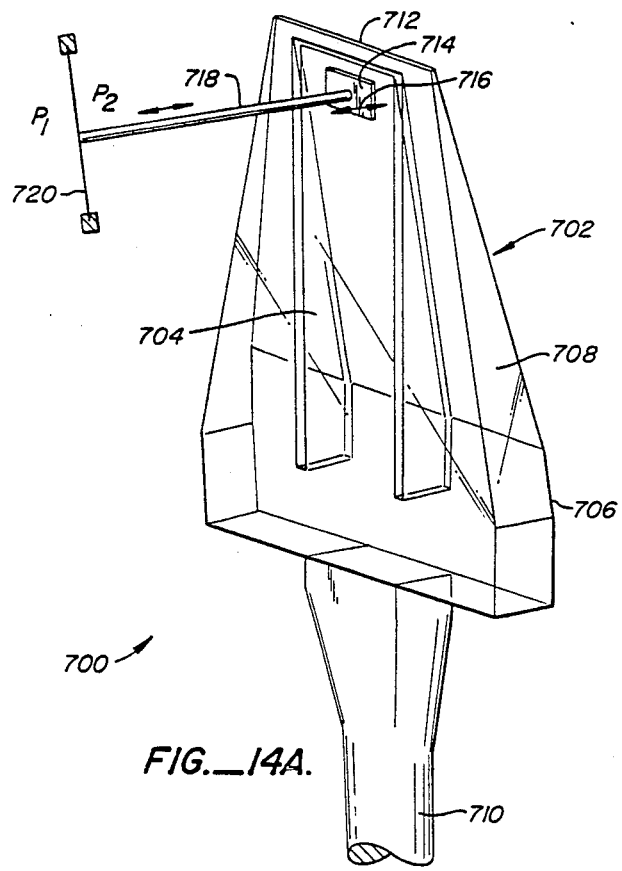
FIG._14A.
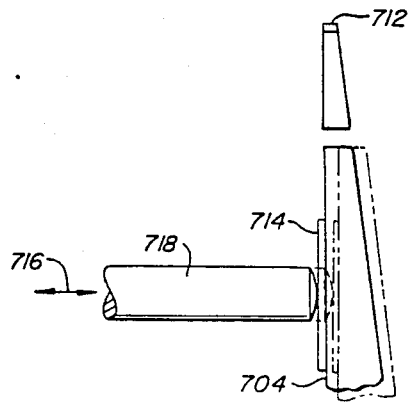
FIG._14B.

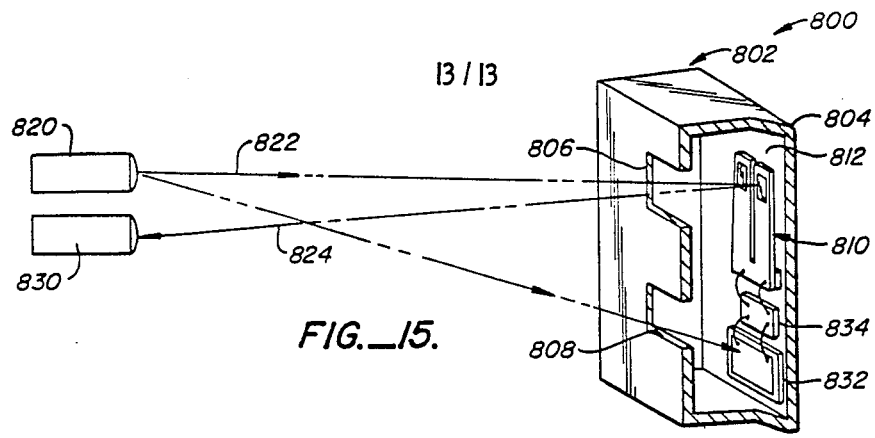
FIG._15.
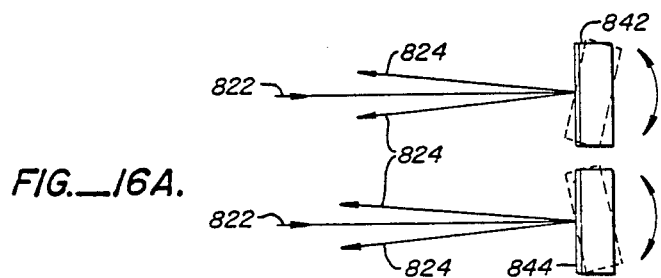
FIG._16A.
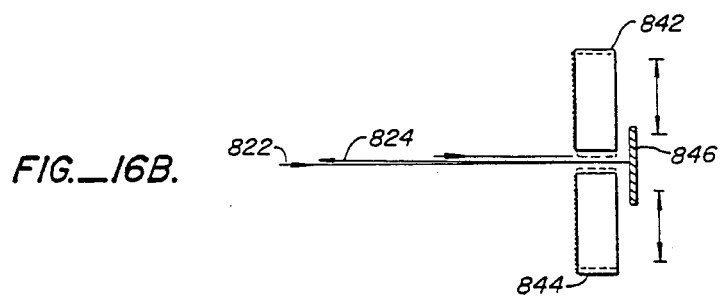
FIG._16B.
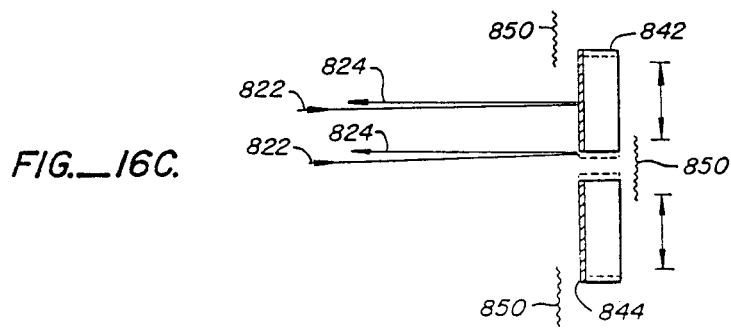
FIG._16C.

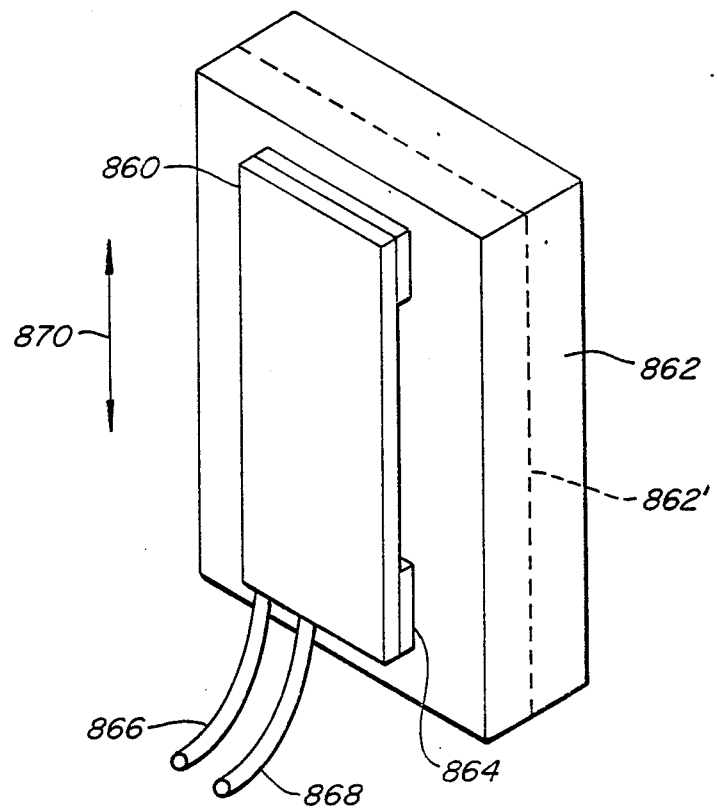
FIG._17A.

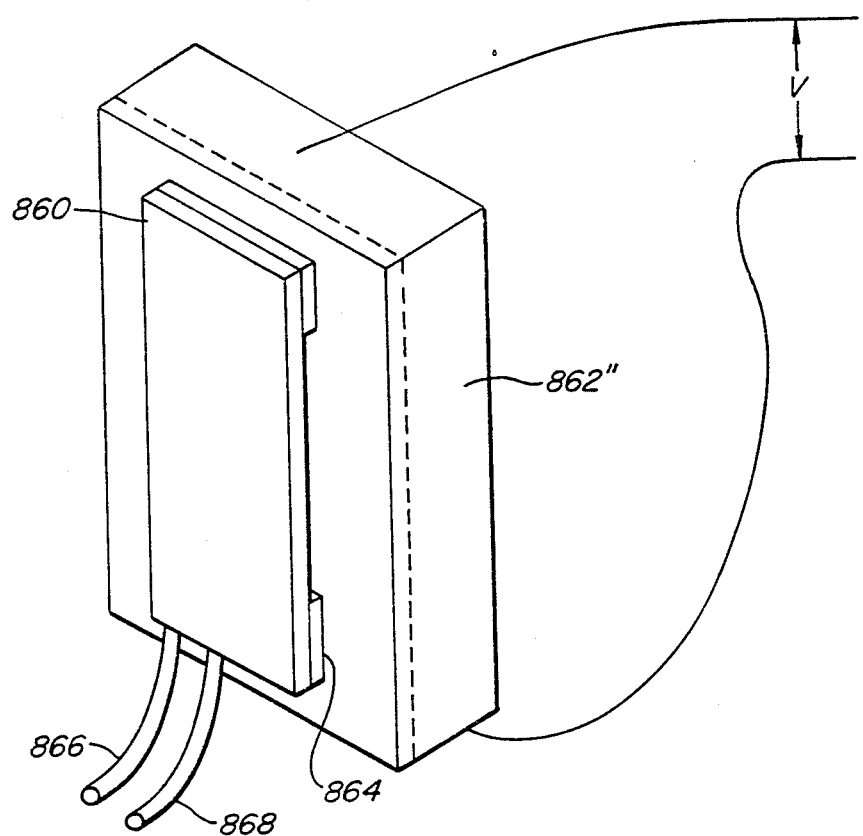
FIG._17B.

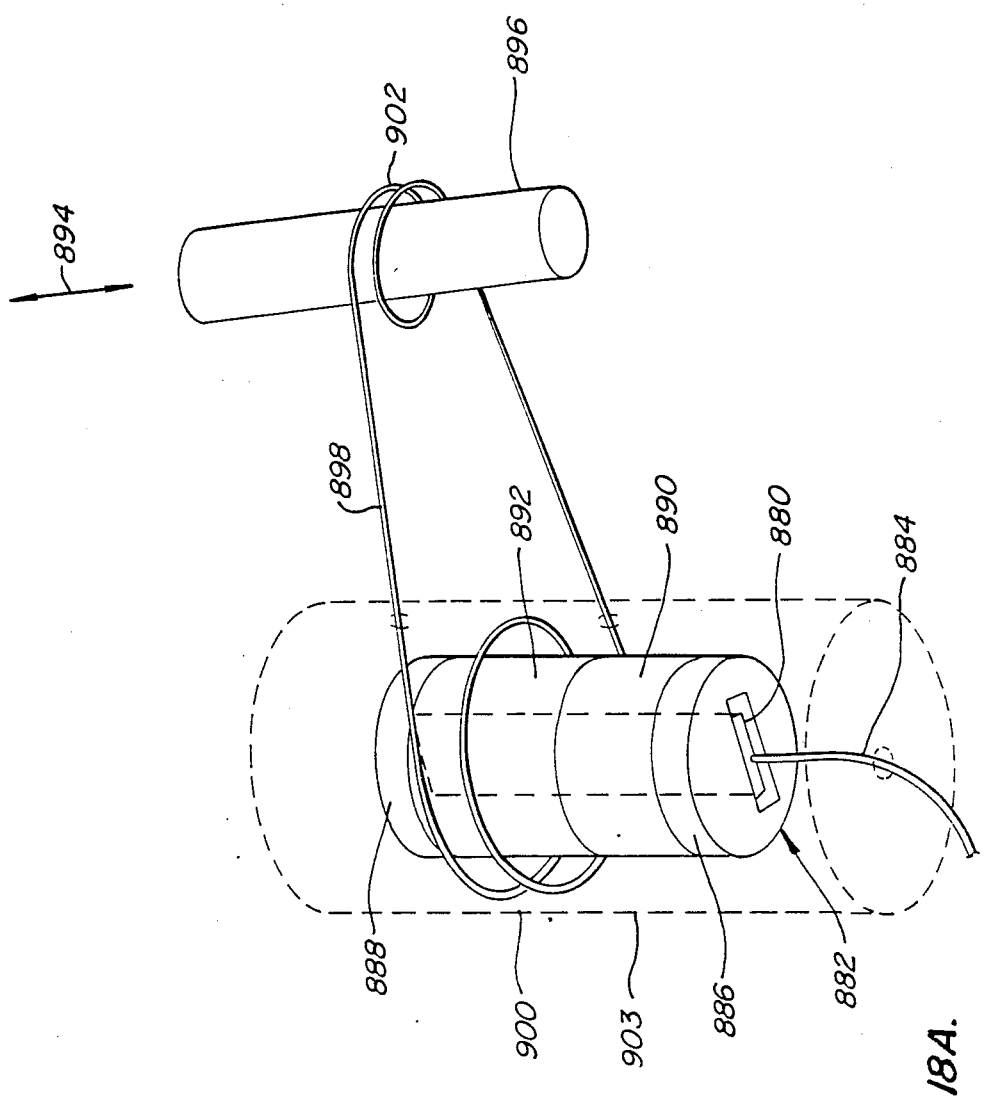
FIG._18A.

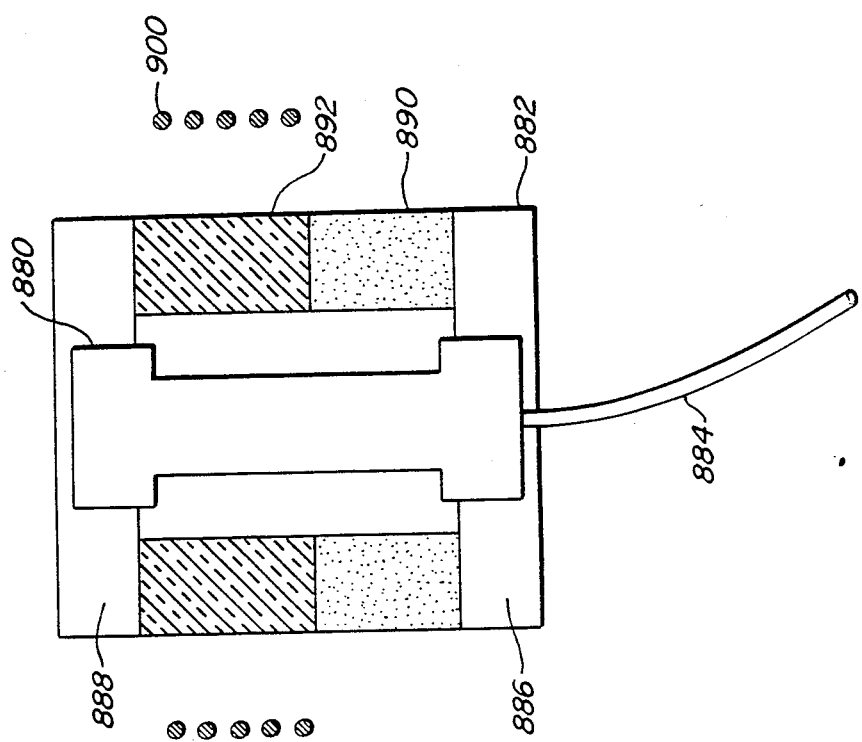
FIG._18B.

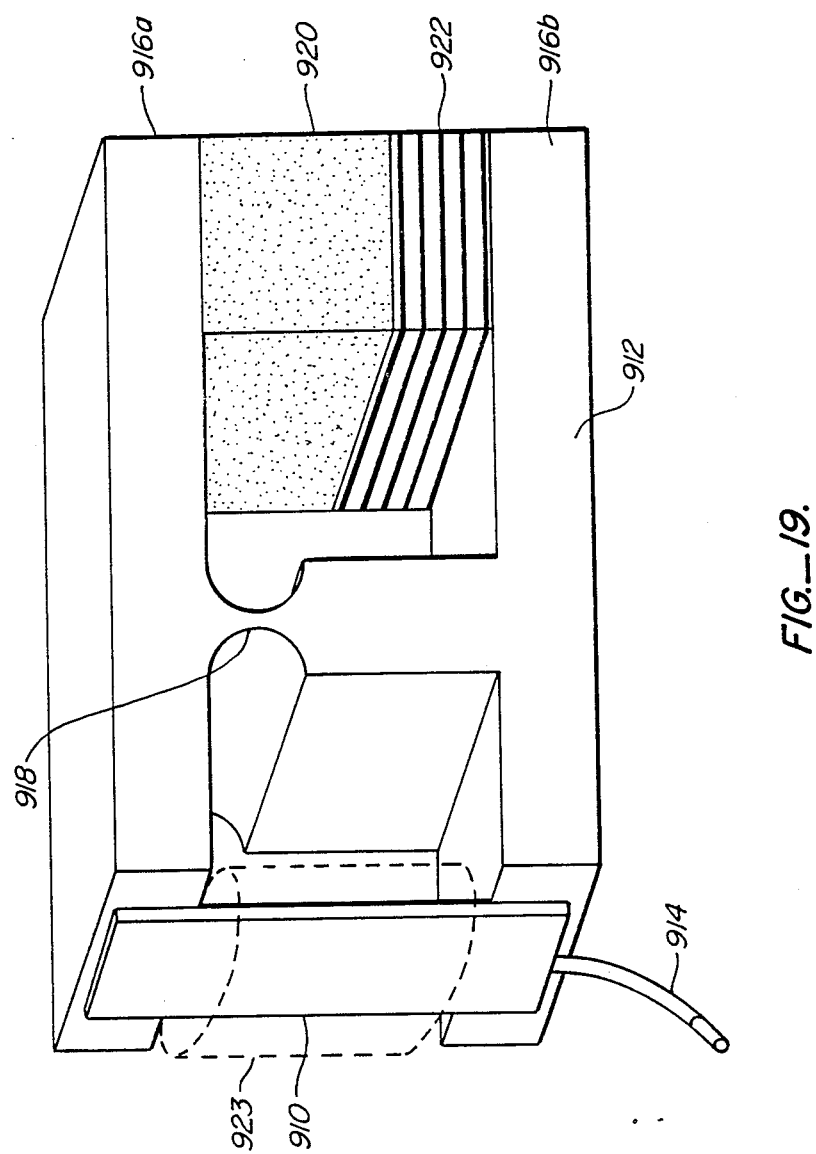

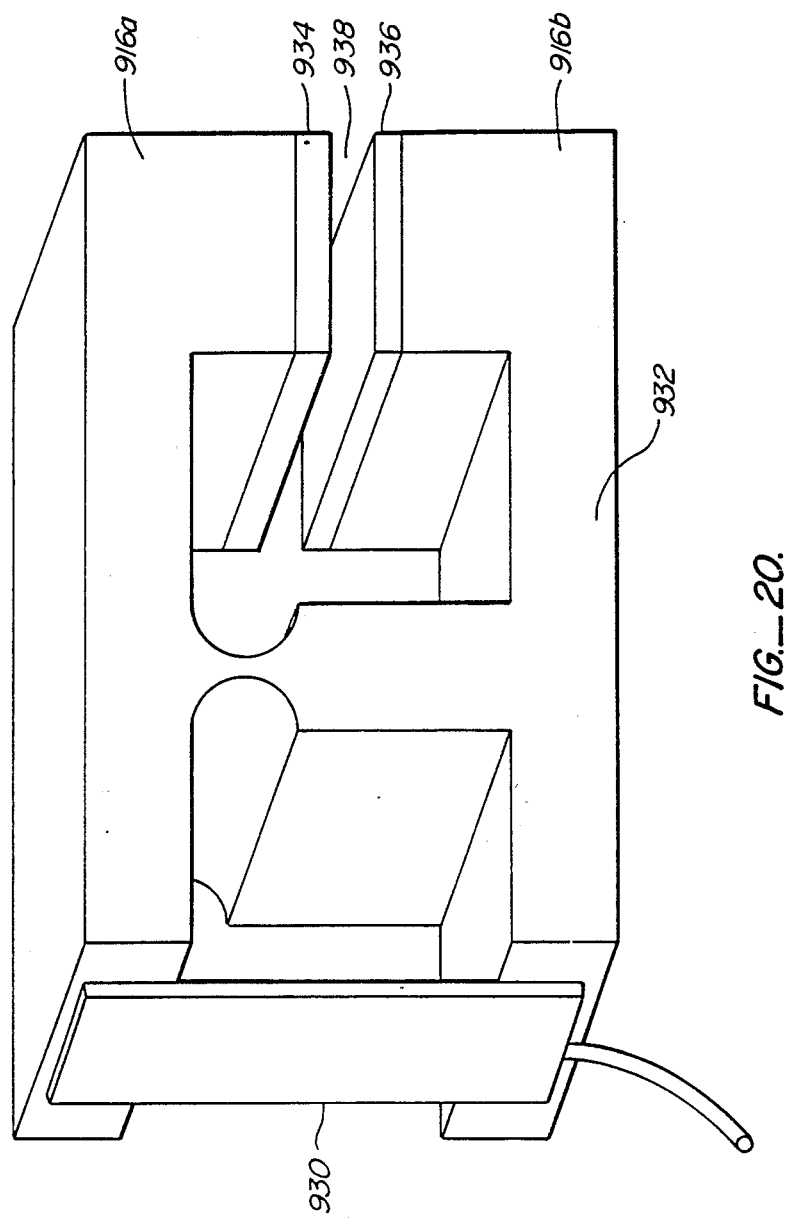
FIG._20.

4,897,541

SENSORS FOR DETECTING ELECTROMAGNETIC PARAMETERS UTILIZING RESONATING ELEMENTS

CROSS REFERENCE TO RELATED APPLICATIONS

This application is a continuation-in-part application of Ser. No. 064,345, filed June 19, 1987, now abandoned, which is a divisional application of Ser. No. 612,060, filed May 18, 1984, now U.S. Pat. No. 4,678,905.

BACKGROUND OF THE INVENTION

This invention relates in general to transducers and in particular to sensors for detecting and measuring electromagnetic parameters. This invention is particularly suitable for use in detecting and measuring electromagnetic parameters using optical devices and methods.

Optical sensors have been developed to replace traditional electrical sensors to measure physical variables not possible with electrical sensors and to provide better performance. Other reasons for preferring optical over electrical signal sensing and transmission is the elimination of electromagnetic interference and inherent electrical isolation.

One type of conventional optical sensors employs fiberoptic techniques. In U.S. Pat. No. 4,071,753 to Fulenwider et al., the ends of an input and an output optical fiber are aligned and light is transmitted from one fiber to the other. Various means (apparently mechanical means) couple the end of the output optical fiber to a mechanical or acoustic source. The mechanical or acoustic signal from the source varies the optical coupling coefficient between the two fibers so that by measuring such coefficient, the mechanical or acoustic information can be measured. Fuller in U.S. Pat. No. 4,419,895 discloses an angular accelerometer comprising a pair of cantilevered optical fibers which are parallel but somewhat misaligned. Angular movement modulates the optical signals coupled between the two optical fibers. By measuring such modulations, the angular accelerations are detected. In the above-described type of transducers, the optical sensor comprises two optical fibers optically coupled. The optical coupling coefficient between the two fibers varies with the physical parameter to be measured, so that by measuring such coefficient, the parameter can be detected and measured.

In another type of optical sensors the physical parameter to be measured modulates the vibratory motion of a transducer element. Such modulation changes the intensity of light coupled between the ends of two optical fibers so that by measuring such changes the physical parameter can be detected and measured. Such type of transducers is disclosed in U.S. Pat. No. 4,345,482 to Adolfsson et al. The transducer element may be a vibrating spring, a ferroelectric or a piezoelectric element. In U.S. Pat. No. 4,379,226, Sichling et al. disclose a somewhat analogous optical sensor. The transducer element used in Sichling et al. is a leaf spring torsional rotational device, a ferromagnetic element attached to a filament or a piezoelectric element such as a quartz crystal. Sichling et al. also disclose an arrangement in which a mirror is attached to a transducer element which reflects light received from the input optical fiber towards the output optical fiber to accomplish the light coupling between the two fibers.

Piezoelectric quartz resonators have been disclosed in more detail in other patents such as U.S. Pat. No. 3,561,832 to Karrer et al. Such resonators exhibit changes in frequency when subjected to stress and may be used to measure stress. A ferromagnetic tuning fork is used for measuring gas pressure as disclosed in U.S. Pat. No. 3,902,355 to Weisser. The resonance frequency of the tuning fork is altered by changes in the gas pressure so that by measuring the modulations in resonance frequency of the tuning fork the gas pressure can be measured In U.S. Pat. No. 4,279,028, Lowdenslager et al. disclose the use of an unsealed tuning fork quartz crystal for measuring atmospheric pressure change using the same principle. In an article entitled "Using the X-Y Flexure Watch Crystal As A Pressure-Force Transducer," Proceedings of 31st Annual Frequency Control Symposium 1977, U.S. Army Elect Command, A. Genis et al. disclose the use of an X-Y flexure watch crystal for measuring pressure by the same principle. None of the above disclosures on the quartz crystal, however, appear to teach the use of the optical properties of the quartz crystal simultaneously with its piezoelectric properties.

An optical sensor utilizing a grating structure connected to a diaphragm in a hydrophone is disclosed by W.B. Spillman in the article entitled "Multimode Fiber-Optic Hydrophone Based On A Schlieren Technique", Vol. 20 No. 3 of *Applied Optics*, February 1981. The grating structure is placed between the ends of two optical fibers to vary the light coupled between the two fibers. Thus an acoustic signal which causes the diaphragm to vibrate will cause a corresponding variation in the light coupled between the two fibers. The acoustic signal is then measured by the modulation in the light coupling between the fibers. Various hydrophones for measuring acoustic waves are disclosed in the above-referenced article by W. B. Spillman.

Piezoelectric sensors have been used to detect machinery vibrations such as engine knock in an internal combustion engine. Such an application is described in U.S. Pat. No. 4,349,404 to Hamisch et al. The high impedance associated with this type of piezoelectric acceleration sensors are prone to electrical noise such as that generated by engine ignition systems. An accelerometer employing a brass cantilevered beam is described by Sorf et al in the paper "Tilting-mirror Fiber-optic Accelerometer," *Applied Optics*, Vol. 23, No. 3, Feb. 1, 1984.

In addition to the detection and measurement of force, pressure, stress and acoustic waves, quartz crystal vibrators have been used to measure temperature. One such instrument, Model HP 2801 manufactured by Hewlett-Packard, Palo Alto, California, is based upon a crystal thermometer described by Hammond in U.S. Pat. No. 3,423,609. Statek of Orange, Calif., manufactures a quartz thermometer tuning fork (Model TS-2). In U.S. Pat. No. 4,398,115 Gagnepain et al. also describes the temperature indicating quartz crystal plate.

Quartz crystal detectors have also been used as highly sensitive micro-balance detectors. Quartz crystals coated with a tacky substance or a substance which selectively absorbs and/or adsorbs a particular chemical or molecule increases the mass of the oscillator causing a decrease in its resonance frequency. Dorman in U.S. Pat. No. 3,561,253 describes a particle detector system using an oscillating quartz crystal plate. Chuan in U.S. Pat. No. 3,715,911 measures the mass of atmospheric particulate matter with a vibrating quartz crystal plate micro balance. Crystals coated with a selectively absorbent coating is described in U.S. Pat. No. 4,111,036 to Frechette et al. (for detecting sulfur dioxide), 4,193,010 to Kompanek and in an article entitled "Analysis of Environmental Pollutants Using a Piezoelectric Crystal Detector," in Intern. J. of Environ. Anal Chem. 1981 Vol. 10, pp.89–98 by Guilbault.

In all the above-described applications for measuring a physical parameter using the quartz crystal, the crystal is used as a non-optical vibrating detector which provides electrical signals for the detection and measurement of the physical parameters. These electrical signals are then processed by electronic circuitry. Such quartz crystal detectors are subject to electromagnetic interference which is undesirable.

Techniques for fabricating quartz crystal resonating structures such as microlithographical, chemical and other manufacturing processes are well known to those skilled in the art. Such processes are disclosed for example in U.S. Pat. Nos. 3,683,213 and 3,969,640 both issued to Staudte. Also well known in the art are the techniques for defining the cut of quartz crystal resonators to provide certain temperature-frequency characteristics, to tune their resonance frequencies, and to define the location and configuration and excitation electrodes to cause movements such as the flexure and twisting (torsional) modes of tuning forks. These movements can be at the fundamental and/or overtone frequencies of the crystal. Examples of these techniques are disclosed in U.S. Pat. Nos. 3,969,641 by Oguchi et al.; 4,377,765 by Koqure et al; 4,382,204 by Yoda and 4,384,232 by Debely. In addition, quartz crystal tuning forks may be vibrated in directions normal to the plane containing both tines of the tuning fork. Such techniques are also well known.

SUMMARY OF THE INVENTION

The transducer apparatus of this invention is for detecting a physical parameter. The transducer apparatus comprises a body which changes in dimension when subjected to the parameter and the resonator connected to the body so that when the body changes dimension in response to the parameter, the body applies a force on the resonator thereby modulating the resonance frequency of the resonator. The transducer apparatus also comprises means for resonating the resonator and means for detecting modulation of the resonance frequency of the resonator caused by the force applied by the body to detect the parameter.

Another aspect of the invention is directed towards a transducer apparatus for detecting an electrical signal. The apparatus comprises a piezoelectric member which transmits light and means for applying the electrical signal to the member to vibrate the member The apparatus further comprises means for supplying light to the member so that the light transmitted by the member is in a direction transverse to the direction of the member, wherein the vibration of the member modulates the light transmitted by the member. The apparatus further comprises means for detecting modulations of the light transmitted by the member to detect the electrical signal.

BRIEF DESCRIPTION OF THE DRAWINGS

FIG. 1 is a partially schematic and partially perspective view of an optical transducer for measuring a physical parameter to illustrate the invention.

FIG. 2A is a schematic view of an optical transducer illustrating another configuration of an optical transducer of this invention.

FIG. 2B is an elevational view of a portion of the transducer of FIG. 2A, illustrating the light absorbent gratings of the invention.

FIG. 3A is a perspective view of a quartz crystal tuning fork resonator illustrating still another embodiment of the optical transducer of the invention.

FIG. 3B is a partial cut-away cross-sectional view of a portion of the resonator of FIG. 3A.

FIG. 4 is a perspective view of a resonator illustrating yet another embodiment of the optical transducer of this invention.

FIG. 5A is a simplified perspective view of a pair of opposing piezoelectric tuning forks with opposing grating patterns to illustrate an alternative embodiment of the optical transducer of this invention.

FIG. 5B is a top elevational view of the pair of tuning forks of FIG. 5A.

FIG. 6 is a schematic view of an optical pressure transducer to illustrate how the optical sensors of this invention can be used for measuring pressure.

FIG. 7 is a simplified perspective view of a micromass balance resonator to illustrate how the optical sensor of this invention is used for detecting particles.

FIG. 8A is a schematic view of a quartz tuning fork resonator transducer or detecting and measuring gaseous pollutants.

FIG. 8A is a schematic view illustrating a further embodiment of a gaseous pollutant detector in which a double tuning fork arrangement is used.

FIGS. 9A, 9B and 9C illustrate a load-sensitive double bar resonator comprising two closed-end tuning fork resonators to illustrate another embodiment of the optical transducer of this invention.

FIG. 10 is a cross-sectional view of still another embodiment of an optical transducer to illustrate the invention, and to also illustrate how the invention of this application may be used to measure force and pressure.

FIG. 11 is a simplified cross-sectional view of a closed-end tuning fork resonator for detecting displacements.

FIGS. 12A through 12E are schematic diagrams illustrating how the optical sensors of this invention may be used for measuring still other physical parameters including light, electrons, x-ray, radiation, electrical signal, magnetic signal and force.

FIG. 13A is a cross-sectional view of a transducer to illustrate yet another embodiment of the optical transducer of this invention.

FIG. 13B is a cross-sectional view of yet another quartz tuning fork type transducer illustrating another embodiment of the optical transducer of this invention.

FIG. 14A is a perspective view of an optical transducer illustrating the another embodiment of this invention.

FIG. 14B is a partial view of the upper section of the transducer of FIG. 14A, illustrating the movement of the central tine.

FIG. 15 is a simplified schematic view of a transducer system where the transducer element is partially cut away and shown in perspective to illustrate another alternative embodiment of this invention.

FIGS. 16A, 16B and 16C are schematic views of the transducer element of FIG. 15 illustrating the different ways in which the vibration of the transducer element modulates a light beam.

FIG. 17A is a perspective view of an optical transducer for measuring magnetic fields.

FIG. 17B is a perspective view of an optical transducer for measuring a voltage.

FIG. 18A is a bottom elevational view of a cylindrically configured optical transducer and of an endless electrical conductor forming two loops for measuring current.

FIG. 18B is a cross-sectional view of the optical transducer of FIG. 18A.

FIG. 19 is a perspective view of a hinged, lever armed transducer which includes a magnetostrictive (or piezoelectric) and temperature compensating elements is used for applying force to an optical force resonator for measuring magnetic field or voltage.

FIG. 20 is a perspective view of a hinged, lever armed transducer which includes a pair of electrically conductive capacitor plates for applying force to an optical force resonator to illustrate how this invention may be used to measure electrical potential.

FIG. 21 is a schematic view of four optical transducers of the type in FIGS. 17A surrounding a conductor carrying current to illustrate a method for measuring current using this invention.

FIG. 22 is a simplified schematic view of a conductor carrying current surrounded by a magnetic core except for a gap and of the optical transducer of FIG. 17A to illustrate a method of this invention for measuring current.

DETAILED DESCRIPTION OF THE PREFERRED EMBODIMENTS

While non-optical transducers may be used in this invention, optical transducers are particularly advantageous. Thus the optical transducers used in applications of this invention will first be described in reference to FIGS. 1–16C.

This invention provides for a miniature size transducer of high sensitivity which provides optical signals immune to electromagnetic interference and noise. In some embodiments of this invention, physical parameters are measured by detecting the frequencies of vibrations of the transducer; such frequencies are not degraded by transmission losses. The quartz crystal transducers of this invention are readily fabricatable since the manufacturing processes of quartz crystals and quartz crystal tuning forks have been developed to the extent that such transducers can be produced with high precision and at low cost. In contrast to conventional transducers, the quartz crystal transducers of this invention are used not only for their piezoelectric properties but also for their optical properties. Fiber optic techniques are used in many of the embodiments of this invention to achieve electrical isolation and immunity to electromagnetic interference and noise.

FIG. 1 is a partially schematic and partially perspective view of an optical transducer for measuring a physical parameter to illustrate the invention. As shown in FIG. 1 the optical transducer 10 comprises an evaluation system 12 and a transducer system 14. The two systems are linked by optical fibers so that transducer 10 is particularly suitable for sensing physical parameters at remote locations. Transducer system 14 can be brought to such remote location to sense the physical parameter whereas the evaluation system 12 may be far away from such remote location.

To provide light to the transducer system 14 for measuring the physical parameter, a light source 16 is controlled by a driver 18 to produce a constant light flux 20 into fiber optic light guide 22. The light source 16 may be, for instance, a light (including infrared) emitting diode (LED) and incandescent light bulb, an arc lamp, or a laser. The optical fiber 22 is optically joined to the base 44 of the piezoelectric quartz crystal tuning fork resonator 24 and provides a path for light 26 entering the quartz crystal from fiber 22. The light flux 26 is conducted by the quartz tuning fork crystal 24 which also acts as a light guide. This light guide phenomenon is a result of the highly polished mirror surfaces of the quartz crystal 24 and the difference in the indices of refraction between quartz and the surrounding medium. This operates in a manner similar to that experienced in step index optical fibers. Instead of mechanically or chemically polishing the surfaces of the quartz crystal, metallic coatings applied to the crystal surfaces may also provide a reflecting surface. The light flux 26 travels along both arms 28 and 30 of quartz crystal 24 as light fluxes 32 and 34 which are converged by the taper sections 36 and 38 of arms 28 and 30. These light fluxes then exit the quartz crystal at surfaces 40 and 42.

The tuning fork crystal resonator 24 is constructed with a base 44 and a pair of tuning arms 28 and 30 which are separated by a gap 46. The pair of tuning arms 28 and 30 vibrate in opposite phase with respect to each other in the plane of the tuning fork in a mode known as the flexure mode at a fundamental vibration frequency in directions depicted by arrows 48 and 50.

The X-cut tuning fork of FIG. 1 is fabricated using microlithographic techniques as described in U.S. Pat. Nos. 3,683,213; 3,969,640; 3,969,641 and 4,377,765. This crystal is most typically used as a timing source for low powered, low cost applications such as in wrist watches Instead of quartz, the resonator 24 may also be fabricated using any other piezoelectric materials such as rochelle salt ($KNaC_4H_4O_6.4H_2O$), barium titanate ($BaTiO_3$), Tourmaline and ADP (($NH_4)H_2PO_4$), or ferroelectric materials such as those referred to in the patents referenced above in this paragraph.

Thin film driving electrodes 52 and 54 can be located along the to, bottom or sides of the arms 28 and 30 but preferably on the top surface as shown in FIG. 1. These electrodes can be manufactured by vacuum deposition of a conductive coating material such as tin oxide, nickel, chrome, gold, silver or a combination of these metal conductors. Upon application of an electrical potential across the two driving electrodes, arms 28 and 30 move in opposite phase and will continue to vibrate if driven in a manner well known in the art.

Light fluxes 32 and 34 which are transmitted through surfaces 40 and 42 are projected on to the end of optical fiber 60. The magnitude of the light flux 62 in the optical fiber 60 depends on the flexural movements of arms 28 and 30. The continuous lateral movement of surfaces 40 and 42 causes a corresponding modulation of the light flux 62. The light flux 62 radiates from the distal end 64 of optical fiber 60 onto light detector 66. Photo detector 66 may be a pin photo diode, a photo-transistor, a photo-resistor or a photo-multiplier tube. The signal from photo detector 66 is amplified by amplifier 68. The amplitude of the AC component of the signal 70 from photo detector 66 is provided by the discriminator circuit 76 to provide an output signal 74 which represents the amplitude of the vibration of the arms 28 and 30 of resonator 24. A digital frequency signal 78 is also generated by discriminator circuit 76. Signal 78 is applied to a frequency counter 80 to provide an output signal representing the physical parameter which affects the vibration of arms 28 and 30 of resonator 24. Signal 78 is also applied through a phase delay or phase-shifting element 84 and driver 86 to light source 88 which can be a LED or a solid state laser.

Light from source 88 is conducted via the light guide 90 to the photo diode or photo voltaic cell 92. In some circumstances, photo voltaic cell 92 may include a voltage regulator, a voltage doubler or other circuitry to assist in generating an oscillating driving signal. Cell 92 provides an output which is connected to the driving electrodes 52 and 54, thereby generating oscillations of the arms 28 and 30. The phase delay element 84 and the rest of the electrical circuit form a feedback control loop that causes the quartz resonator to remain in oscillation with the resonator 24 as the frequency controlling element. Instead of employing a feedback loop, the crystal can alternatively be driven by periodic or random pulses of light from light source 88.

To measure a physical parameter the transducer system 14 is placed in such a manner that the frequency of vibration and/or the amplitude of vibration of resonator 24 is modulated by such physical parameter. Such modulations result in modulations of light flux 62 which is detected by photo-detector 66. Photo-detector 66 provides an electrical signal representing the light flux 62. The electrical components in evaluation circuit 12 then provides electrical signals 74 and 82 representing the amplitude, phase and frequency representing the amplitude, phase and frequency of the modulations caused by the physical parameter No additional electrical circuitry is used in the transducer system 14 or the connections between transducer system 14 and the evaluation system 12. Evaluation system 12 can be placed away from the location of measurement and in an electrically isolated environment In this manner, the transducer system 10 of FIG. 1 is immune from electromagnetic noise interference. The transducer system 14 forms a disposable part of the optical transducer 10. The quartz crystal tuning fork resonator 24 is of low cost as are the optical fiber leads within system 14 so that the entire system 14 can be disposed at will. The optical fiber leads of system 14 in the disposable arrangement may be connected to long optical fiber cables for connection to evaluation system 12 in a conventional manner.

The resonance frequency of arms 28 and 30 of resonator 24 may be controlled. For example, metal film weight 96 and 98 may be vacuumed deposited on resonating arms 28 and 30 during fabrication of the quartz resonator 24. To increase the resonance frequency of the resonator, portions of the weights 96 and 98 may be trimmed in a convenient manner such as by a laser. The appropriate amount of trimming may be performed to adjust the resonance frequency of resonator 24 to the desired frequency. In addition, differential trimming of the weights 96, 98 allows the matching of resonance frequencies of the two arms thereby optimizing the Q or quality factor of the crystal.

FIG. 2A is a schematic view of an optical transducer illustrating an alternative embodiment of optical transducers of this invention. In this embodiment a single optical fiber or a bundle of fibers 100 connects a quartz crystal tuning fork resonator 102 of a transducer system 14 and an evaluation system 12. Turning first to the evaluation system 12, light source 106 (which can be an LED, laser or arc-lamp) supplies a light flux 108 to fiber 100 to the vibrating ends of arms 110 and 112 of resonator 102. The light flux is modulated by the light absorbent gratings 114 and 116 as shown in FIG. 2B. Light flux 118 that makes its way through this double grating structure is conducted by the arms 110 and 112 acting as light guides to the photo-cell 120 located at the base of the quartz crystal resonator 102 as described in reference to FIG. 1. In response to light flux 118, photo-cell 120 provides an output to driving electrodes (partially shown in FIG. 2A) of resonator 102 through wires 122 and 124 to vibrate arms 110 and 112 in the fundamental flexure mode in a manner similar to that described in reference to FIG. 1.

Part of the light flux 118, however, is reflected from the surface of photo cell 120. This is accomplished by either using the natural reflectivity of silicon of cell 120 or coating a partially reflecting mirror on the front surface of cell 120. In addition, a selective narrow band light absorbent coating can be located on the surface of the quartz crystal 102 to intercept the light flux 118. One preferred location of this coating is in front of the mirror coating of cell 120. The temperature of the quartz element 102 will be increased by the absorption of light energy by the gratings 114 and 116 and the absorption of light energy within this narrow band by this selective absorbent coating. The temperature of the quartz element 102 can be controlled by varying the amount of the light energy within the narrow band It will be understood that the temperature of the crystal may be controlled in all the other embodiments of this invention in a manner similar to that just described.

The reflected light 126 from cell 120 is only partially absorbed by its second passage through the double grating structure 114 and 116. The main part of light 126 passes back through the gap and the grating, is conducted back along optical fiber 100, through conventional fiber optic splitter 128 to impinge on photo detector 130. The signal from the photo detector is amplified by amplifier 132 and processed by analog and digital circuits of network 134 to provide an output signal 136 indicative of either the frequency, the amplitude, or phase of resonator 102. The vibrations of arms 110 and 112 of resonator 102 are influenced by a physical parameter to be measured and output 136 will indicate such modulation influence. The physical parameter is then detected and measured by means of the output signal 136. Network 134 also provides a signal 137 of the appropriate phase to light source driver 138 to control the light intensity of the light source 106 for resonating the resonator 102 in a conventional manner. The light source 106 normally provides a constant light flux 108. In some circumstances, however, it can be modulated or pulsed to initiate oscillation of the resonator 102.

Arms 110 and 112 have tapered sections 140 and 142 whose taper are shallow enough for a given index ratio between quartz and the surrounding medium to allow for total internal reflection of the light fluxes 118 and 126. Gratings 114 and 116 are each formed by alternately arranged transparent and light absorbing strips. The grating 116 located on the ends of arms 110 and 112 move in opposite phase with respect to one another in directions of arrows 144 and 146. Instead of being light absorbent, grating 116 may also be made of a light reflecting material such as mirrors which reflect part of light 108 back towards photo detector 130. In either configuration, the modulations of the vibrations of arms 110 and 112 caused by a physical parameter are detected by photo detector 130.

FIG. 3A is a perspective view of a quartz crystal tuning fork resonator illustrating an alternative embodiment of optical transducers of the invention. FIG. 3B is a partial cut away cross-sectional view of a portion of the resonator of FIG. 3A. In this embodiment an optical equivalent of the grating structure of FIG. 2 is manufactured at the same time when the resonator is photolithographically produced. This can reduce the number of steps and the cost required for its production. The evaluation system 12 of the alternative embodiment of FIGS. 3A and 3B is the same as that of FIGS. 2A and 2B and has been omitted for simplicity. The same referenced numerals for the optical fiber 100 and light flux 108 therein is used in FIGS. 3A and 3B as in FIGS. 2A and 2B. As shown in FIG. 3A a light flux 108 is transmitted through optical fiber 100 joined to the base of modified tuning fork resonator 150. Light flux 108 is conducted by vibrating arm 152. As shown in FIG. 3A vibrating arm 152 ends in a plurality of tapered sections 154a which converge the light flux 108 and act as a modulating grating structure. Arm 158 has a U-shaped portion at its end with similar tapering end sections 154b opposite to sections 154a. The two groups of opposing tapering sections 154a and 154b form the optical equivalent of the grating structure of FIGS. 2A and 2B. FIG. 3A shows the configuration for two opposing groups of three tapered sections in each group. It will be understood that 1, 2 or more than 3 tapered sections may be used in each group and are within the scope of this invention.

Part of the light flux 108 is internally reflected by the sides 155 and converges light flux 108. Part of the light flux 108 is conducted into the upper part of arm 158 of resonator 130 as light flux 160. This transmitted light 160 is then reflected by mirror 162 as reflected light flux 164 which retraces its optical path back down light guide 152. Part of the light flux 108, however, as shown by arrow 166, reflects off the outside tapered surface 157 of arm 158 and is lost. The optically conductive end surfaces 168 and 170 of tapered sections 154a, 154b are constructed so that in the neutral non-vibrating position they are approximately 50% overlapping to provide the maximum optical modulation. Of the light flux that does exit from surface 168, only that portion which enters surface 170 will be reflected back. Thus, the relative movement of arms 152 and 158 changes the ratio of the energies in the light fluxes 160 and 164. Part of the returning light flux 164 is conducted back through optical fiber 100 and is detected as described above in reference to FIG. 2A. Part of the returning light flux 164 falls on photo cell 172 which generates a voltage therefrom to drive electrodes 174 and 176. Since light flux 164 varies periodically, cell 172 applies an oscillating current causing arms 152 and 158 to vibrate in opposite phase at their resonance frequency.

Arm 158 is further tapered at 178 to reduce its mass so that arms 152 and 158 may have substantially the same resonance frequency as before. Thin film weights deposited on the two arms may be used to adjust their resonance frequencies to their desired value. The above described opposing groups of tapered sections increase the sensitivity of the optical sensor. In reference to FIG. 1, the opposing surfaces of resonator 24 and optical fiber 60 may be shaped in a similar manner to increase the sensitivity of the optical sensor 10. Alternatively, the opposing surfaces may be provided with gratings similar to grating 114 and 116 of FIG. 2 to increase the sensitivity of the sensor. The opposing groups of tapered sections of FIGS. 3A, 3B and/or the gratings of FIG. 2B may also be applied in a similar manner to other embodiments of this application, including but not limited to those of FIGS. 5A, 7, 8A, 8B, 9A, 10, 11, 13A and 14A.

FIG. 4 is a perspective view of a resonator illustrating yet another alternative embodiment of optical transducers of this invention. The tuning fork resonator of FIG. 4 is particularly adapted for measurements with a resonator vibrating in the torsional mode as well as the flexure mode of the previous embodiments of FIGS. 1-3. Measurements of physical parameters employing a tuning fork resonator vibrating in the torsional mode is advantageous in that the resonance frequency of the torsional mode vibration can vary substantially linearly with temperature of the resonator and is a single valued function. In contrast, the resonance frequencies of resonators vibrating in the flexure mode has a frequency-temperature characteristic in the form of a parabola. Thus, a resonator such as that shown in FIG. 4 is advantageous for measuring temperature. Alternatively, the resonator of FIG. 4 may be vibrated in both the flexure and torsional modes. The two different vibrational modes can be electronically separated since they can differ substantially in frequency. For example the torsional mode can operate at 200 kHz with the flexure mode at 20 kHz.

As shown in FIG. 4 three different vibrational modes of resonator 180 are illustrated by arrows 182 and 184 for the torsional mode, arrows 183, 185 for the perpendicular or normal mode (where the arms vibrate in directions normal to the plane of the two tines) and arrows 190 and 192 for the flexural modes. Resonator 180 comprises arms 186 and 188. Light 194 from a light source similar to that of source 16 of FIG. 1 is conducted through optical fiber 196 to arm 186. Fiber 196 is optically continuous with the base of resonator 180 such that light flux 194 is also conducted along arm 186 as light flux 198. Arms 186 and 188 taper in two different directions. One taper is on one side of arm 186 shown as 200. The other taper is on the bottom surface of arm 186 shown as surface 203. The first taper shown by surface 200 converges light flux 198 towards mirror 204. Light flux 198 is reflected off mirror 204 as light flux 206. The second taper as shown by surface 203 continues to converge light flux 206 towards surface 208. Part of this light crosses the small gap 210 and re-enters the resonator through surface 212 of arm 188. This light is then reflected by mirror 214 as light flux 216 down the arm 188 towards the base of resonator 180 as light flux 222. Flux 222 is then conducted by optical fiber 224 to the photo detector similar to detector 66 of FIG. 1. Arm 188 has corresponding tapering sections to those of arm 186 shown as surfaces 220 and 221.

The two tapers result in very small rectangular areas 208 and 212 through which the two arms 186, 188 are optically coupled. When the two arms 186, 188 vibrate in either the torsional mode (arrows 182-184), flexural mode (arrows 190, 192) or the perpendicular (normal) mode (arrows 183, 185) or any combination of the three, the light coupling coefficient between the two arms of the resonator will be altered thereby modulating light flux 222 which is then detected by the photo detector.

Light flux 226 which is generated by the optical and electrical feed back discussed above in reference to FIG. 1 is supplied through optical fiber onto photo cell 230. Cell 230 generates a varying electrical current for driving electrodes 232 and 234 to resonate the resonator 180. Locating fiber 228 and cell 230 between optical fibers 196 and 224 produces a compact configuration. Comparing FIGS. 3A, 3B and 4 to FIGS. 1, 2A and 2B, it will be obvious that the resonators of FIGS. 3A, 3B and FIG. 4 together with the optical fiber leads attached thereto form the disposable portions of the optical transducer system and are disposable at will.

The electrical pattern on resonator 180 can be configured to vibrate the arms in a torsional and/or flexure mode. These techniques are well known in the art and are described in U.S. Pat. Nos. 4,377,765 and 4,382,204. If both modes are utilized in one measurement, light flux 226 contains both separate driving frequencies to independently drive the two modes. Thus, in the previous embodiments metal film weights may be deposited on resonator 180 for adjusting the resonance frequencies. A perpendicular flexure mode in which the arms move perpendicularly to the crystal plane as illustrated by arrows 183 and 185 can also be implemented with the appropriate locations of the driving electrodes.

If resonator 180 is vibrated in both the flexure and torsional modes simultaneously, two different physical parameters may affect each mode by different amounts. By calibrating the effects of each parameter on the two modes separately, it is possible, by measuring the frequencies of the modes, to measure the two parameters simultaneously. Two such parameters may be temperature and pressure.

FIG. 5A is a simplified perspective view of a pair of opposing piezoelectric tuning forks with opposing grating patterns to illustrate still another alternative embodiment of the optical transducers of this invention. FIG. 5 is a top view of the tuning forks of FIG. 5A. Light flux 250 is conducted by optical fiber 252 and collimated into a beam 254 by lens 256. Lens 256 may be a conventional condensing lens or a grated-index rod micro lens such as that manufactured by Nippon Sheet Glass Ltd. Light beam 254 can also be directly from a laser. Part of the collimated light beam 254 passes through the first quartz tuning fork 258 and the second quartz tuning fork 260 with their opposing grating elements 262, 264 as shown in FIG. 5B. Grating 262 is located on arms 266 and 268 while the opposing grating is located on arms 270 and 272. Light from the collimated beam that passes through this grating structure is projected onto photo cell 274 which produces an electrical current out of phase with the movement of the two tuning forks. Electrical connections 276 and 278 connect the output of the photo cell to drive tuning fork 260. The driving electrodes of tuning fork 260 are connected to the driving electrodes of tuning fork 258 in such a manner that the two tuning forks will vibrate in opposite phase. The connections are as shown in FIG. 5A. Thus, when arms 266 and 268 are moving apart flexurally arms 270 and 272 are moving towards each other thereby enabling the opposing grating structure to modulate the light beam 254.

Optical fiber 252 also serves as the fiber to receive the light modulated by the grating structure for measuring the physical parameter. The first grating 262 is made of a light absorbing material or phosphor which can be used to indicate temperature. The second grating 264 is made of a light reflecting material. Thus, the light 278 reflected by second grating 264 and passes through transparent sections of grating 262 and is focused by lens 256 onto optical fiber 252 for detection by a photo detector in a manner described above in reference to FIG. 1, 2A and 2B. The light so detected is modulated by the combined actions of the two tuning forks. In this manner, the physical parameter modulating the vibrations of the two tuning forks can be detected and measured. As in the previous embodiments, the resonance frequencies of the two tuning forks may be adjusted by trimming metal film weights deposited thereon. If necessary, additional interconnection of electrodes between the two tuning forks can be made to help synchronize their movement.

In the above description the two tuning forks are vibrated in their fundamental flexure modes. By relocating the gratings to positions 280, the first overtone harmonic vibration of the flexure mode can be detected. Conventional electrode patterns well known in the art are used to drive and generate this overtone vibration. While in FIGS. 5A, 5B, tuning forks 258, 260 are shown in the form of flat plates with thin thickness, it will be understood that their thicknesses are not limited to those shown but can be increased at will to be greater than their widths without affecting the functions of the tuning forks. The cross-sectional dimensions of the transducers in the other embodiments of this application can be similarly varied.

The two tuning forks are preferably placed close together as shown in FIG. 5B. The two grating structures overlap by approximately 50% as shown in FIG. 5B so that each transparent strip of grating structure 262 overlaps on one side half of corresponding opaque strip of grating structure 264. The opaque strips of grating structure 264 are similarly located with respect to grating 262. With such an arrangement maximum sensitivity to the relative movement between the two tuning forks is obtained.

Using phosphor to construct the two grating structures has the advantage that the temperature of the environment of the tuning forks can be measured simultaneously with other physical parameters discussed above. Techniques using phosphor to measure temperature are disclosed in U.S. Pat. Nos. 4,075,493 and 4,215,275 to Wickersheim and U.S. Pat. No. 4,245,507 to Samulski.

FIG. 6 is a schematic view of an optical pressure transducer to illustrate how the optical sensors of this invention can be used for measuring pressure. As shown in FIG. 6 the pressure transducer 300 comprises a tubular enclosure 302 enclosed by an isolating diaphragm 304. Within the enclosure 302 is placed a quartz tuning fork type resonator 306 of the kind shown in FIG. 3A. While the resonator of FIG. 3A is shown in FIG. 6 for illustrating the pressure transducer it will be understood that any one of the tuning fork transducers described above can be used instead. The tuning fork resonators of the types described in reference to FIGS. 7, 8A, 8B, 9A, 9B, 9C and 10 may also be used instead. All such configurations are within the scope of this invention.

The compliance of diaphragm 304 allows equilibrium between the internal pressure inside enclosure 302 and the external pressure outside of it. Thus, to measure the pressure of a certain environment, enclosure 302 is placed with its outlet leading to diaphragm 304 within such environment so that the internal pressure within the enclosure is equal to the pressure of the environment to be measured. The pressure inside enclosure 302 changes the gas density inside the enclosure and thus also the resonance frequency of resonator 306 and is transformed into an optical signal in the manner described above. Attached tubing 308 provides a uniform outside diameter to the pressure transducer while providing space for the optical fiber 310 and other instruments. The pressure transducer of FIG. 6 can be readily used as a catheter in medical applications. The pressure sensitivity of the transducer can be changed by placing different gases or gas mixtures with different density-pressure or viscosity-pressure characteristics surrounding the resonator.

The pressure transducer of FIG. 6 can be used as a level detector by placing the transducer in a fluid near the bottom of a container and relating the pressure measured to the height of the fluid above the transducer if the density of the fluid is known or is measured. An additional pressure transducer of the same type placed in the container above the level of the fluid can measure and compensate for barometric pressure changes. To measure the density of the fluid, two pressure transducers are placed in the fluid at a known vertical distance apart. The pressure differential between the two locations of the transducers will give the density of the fluid. This, combined with the pressure measured inside the fluid at the bottom of the container, will give the fluid level.

FIG. 7 is a simplified perspective view of a micromass balance resonator to illustrate how the optical sensor of this invention is used for detecting particles. As shown in FIG. 7 the resonator 350 is placed in an enclosure (not shown) and is connected to an evaluation system (also not shown) in a remote monitoring location via an optical fiber 352. This fiber can be configured into a rectangular end section 354 in order to more optimally interface with the resonator. The two vibrating tines 356 and 358 modulate the light reflected from a mirror 360 in a manner similar to those embodiments described above. An aperture plate 362 is positioned in front of the tuning fork and contains two open windows 364 and 366 which allow air born particles to pass into the enclosure and impinge upon and adhere to two areas 368 and 370 on the two tines. For very small particulates of 1 micron or less a coating of gold or nickel can be the adhesion surfaces 368 and 370. For particulates larger than 1 micron a sticky substance such as a thin layer of high temperature vacuum grease can adhere these particles. The additional mass of these particles increases the weight of the tines causing a corresponding decrease in the resonance frequency. Thus, the weight of particulate matter adhering to the crystal may be measured by measuring the corresponding change of the resonance frequency of the tuning fork 350.

As shown in FIG. 7, tuning fork 350 includes a frame 372. This facilitates the positioning of mirror/photocell 360 with respect to the two tines 368 and 370 so that no extra parts will be necessary to hold the mirror in position with respect to the tines. Thus, the resonator of FIG. 1 may also include a frame so that optical fiber 60 can be attached to the frame to fix its position relative to the two tines 28 and 30. In reference to FIG. 2A resonator 102 may also be integral with the frame so that optical fiber 100 can be attached to the frame.

FIG. 8A is a schematic view of a quartz tuning fork resonator transducer for detecting and measuring gaseous pollutants. Vibrating tuning fork 400 can be of any of the types previously described. Both arms of the tuning fork 400 have chemically active compounds illustrated by 402 and 404 which bond to specific chemical compounds to be detected. The rest of the quartz crystal can be coated with a protective coating such as steatite or spinel which is not chemically active. The housing 406 contains a semi-permeable membrane 408 which selectively allows passage of the gas to be detected from the outside to the inside of the enclosure. The change in the mass of the tuning fork arms caused by the adherence of the gas molecules to areas 402, 404 causes a change in the resonance frequency of the tuning fork which can be remotely detected and measured. For instance, if membrane 408 is hyperphobic and constructed from micro channel teflon which allows the passage of most gases except water vapor and if locations 402 and 404 are coated by a thin film of paladium, then transducer 400 can be used to detect the presence of most gases. More selective chemical sensors depends upon the nature of the membrane 408 and the bonding orsorptivity nature of the material on the tines. For example, the membrane may be selectively chemically active to a particular chemical or antigen, resulting in the release of a gas subsequently sorbed by the areas 402 and 404.

The transducer of FIG. 8A may also be used to detect pressure through the detection of condensation of a gas on the transducer. If the temperature of the gas surrounding the transducer is kept substantially constant, the condensation of the gas on the transducer is proportional to the pressure of the gas. By measuring the mass of condensation on the transducer, the pressure of the gas can be measured.

FIG. 8B is a schematic view illustrating a further embodiment of a gaseous pollutant detector in which a double tuning fork arrangement is used. Here the two tuning forks 420 and 422 vibrate at two separate and distinct frequencies. The enclosure 424 has gas permeable regions 426 and selective sorbent regions 428 and 430 which can be different materials and which therefore detect different gases. The input light beam 432 is modulated by the movement of both tuning forks to produce a modulated output signal 434 which contains the two resonance frequencies of the two tuning forks. An electrical processing unit (not shown) can separate these two different frequencies and thereby determine the changes in the frequencies and thus the amount of each of the two gases deposited on the two tuning forks. In other instances, one of the tuning forks contains no chemically sorbent area but operates as a temperature or pressure sensor thereby forming a combined temperature-chemical sensor or pressure-chemical sensor. This capability is particularly useful where the detection of a chemical is highly dependent upon its temperature or pressure. In a similar manner more than two tuning forks, including tuning forks of the closed-end type (described below) may be employed to measure a number of gases or to monitor the temperature and pressure and to detect a chemical. Obviously tuning forks of shapes different from those shown in FIG. 8A may be used, such as tuning forks shown in FIGS. 1, 2A, 3, 4, 5A, 9A and 10. All such arrangements are within the scope of this invention.

FIGS. 9A, 9B and 9C illustrate still another alternative embodiment of the optical transducers of this invention, which includes a load-sensitive double bar resonator comprising two closed-end tuning fork resonators. The resonance characteristics of closed-end tuning fork resonators are well known in the art. The optical modulation techniques of the closed-end tuning fork resonators are similar to the open-end tuning fork resonators described above. In reference to FIGS. 9A and 9C the two closed-end tuning fork resonators 450 and 452 vibrate in substantially opposite phase so that light-absorbent grating 454 in combination with light-reflective grating 458 and light-absorbent grating 456 in combination with light-reflective grating 460 modulate the light reflected from gratings 458, 460 towards lens 464 which then focuses the reflected light toward optical fiber 462 for detection. The mirror/photocell 466 performs the same function as the element 274 of FIGS. 5A and 5B.

As shown in FIG. 9B the pair of closed-end tuning fork resonators are placed symmetrically in an enclosure 468. The enclosure 468 is separated from the environment by a flexible diaphragm 470 which senses the pressure differential between the inside pressure P2 and the outside pressure P1 thereby causing a change in the force loading of the closed-end tuning fork resonators. A change in the force loading changes the resonance frequencies of the two resonators and the transducer of FIGS. 9A, 9B and 9C can be used to measure the pressure differential. Instead of measuring pressure differentials, the transducers of FIGS. 9A, 9B and 9C can also be used to measure a compression or tension force applied to the center of the diaphragm. Thus a weight 472 placed at the center of the diaphragm will apply a force to the resonating structure and change their resonance frequencies as does any acceleration or vibration movement in the direction of the arrow 471.

FIG. 10 is a partially cross-sectional and partially elevational view of yet another optical transducer of the invention to also illustrate how the invention of this application may be used to measure force and pressure. As shown in FIG. 10 a quartz crystal resonator 500 of the shape shown is used to measure the pressure or force P1. An optical fiber 502 sends and receives optical signals to resonator 500. Resonator 500 is enclosed by a housing 503 and a diaphragm 504 as in the previous pressure transducer embodiments. A pressure or force P1 acts on the diaphragm 504 to change the resonance frequencies of the two bar resonators 506 and 508. The two bar resonators are preferably loaded by the same load so that they have the same resonance frequencies to simplify the detection and measurement of the modulations of their resonance frequencies. To insure that the two resonators are loaded by the same load P1 should be applied to the diaphragm 504 in a symmetrical manner.

In between the two bar resonators are two arms 510 and 512. Light flux 514 is supplied through optical fiber 502, travels down arm 510, crosses the gap 516 between the two arms to arm 512, is reflected by the mirror on the front surface of photo cell 518, retraces its path to optical fiber 502 and is then transmitted to a photo detector in a manner similar to that described above in reference to other embodiments. Bar resonators 506 and 508 are each equipped with protruding portions forming shutters 522, 524. Vibrations of the bar resonators 506 and 508, through the shutters 522 and 524, modulate the light flux reflected back towards optical fiber 502 in such manner that the force transmitted by diaphragm 504 to the resonator 500 can be detected and measured by measuring the light flux conducted back by optical fiber 502. As in the other embodiments described above, the transducer shown in FIG. 10 forms the disposable part of a measuring instrument connected to optical fiber 502 where the instrument may be located remote from the location of measurement.

The amount of pressure actually transmitted by the diaphragm to resonator 500 depends on the stiffness of the diaphragm. If the diaphragm is stiff, much of the pressure may be born by the frame of the enclosure 503 and only a smaller portion by the resonator. By selecting a diaphragm of the appropriate stiffness, the transducer 500 can be tuned to detect pressure in a desired range.

The optical sensors of FIGS. 9A, 9B and 9C and of FIG. 10 are two embodiments employing closed-end tuning fork type transducers. As described above both embodiments may be used for measuring pressure or force. The two embodiments, however, can also be used for measuring a number of other physical parameters if a mass 472 of FIG. 9B is placed on top of the transducer in either embodiment. Both can be used to measure acceleration. If the mass put on top of the transducer is at zero acceleration, the modulation of the resonance frequency simply indicates the weight of the mass. If the transducer is accelerated, however, the acceleration of the transducer will cause the mass to exert a force on the transducer that is greater or less than its own weight depending on the direction of acceleration.

Elements 510, 512 can be made to vibrate by driving electrodes (not shown) in a conventional manner. Either one of the two elements may be made into an open-end tuning fork with a gap therein. In FIG. 10, element 510 is shown to have a gap 563 (shown in phantom) so that element 510 becomes an open-end tuning fork with two symmetrical tines separated by gap 563. The open-end tuning fork formed by either element can be made to vibrate at a distinguishable frequency from the vibrations of the closed-end tuning fork. If such open-end tuning fork is used to measure temperature, the entire apparatus of FIG. 10 may be used to measure simultaneously temperature and another physical parameter such as pressure, force or acceleration.

The two embodiments of the closed-end tuning fork can also be used for measuring vibration or acoustic waves. Diaphragm 470 or diaphragm 504 are vibrated by the acoustic wave causing a varying pressure or force to be applied to the transducer of the two embodiments. Such varying force or pressure is sensed in the same manner as that described above in reference to FIGS. 9A, 9B, 9C and 10.

The two embodiments of the closed end tuning forks may be used in a manner similar to that for the open-end tuning fork described in reference to FIGS. 4, 7, 8A and 8B for detecting temperature, chemicals and particulates. All such applications are within the scope of this invention.

In addition to the above applications, the two embodiments of the closed end tuning fork may also be used for detecting displacement (strain) FIG. 11 is a simplified cross-sectional view of a closed-end tuning fork resonator for detecting displacements. Closed-end tuning fork 540 is either connected to or integral with a compliant multiple leaf spring element 542. The spring element, particularly when configured from a single piece of quartz, acts as a low hysteresis, highly linear and compliant spring element. A displacement dX bends the quartz beams 544 having a spring constant K. This results in a tension or compression force on the tuning fork resonator 540. Thus, spring 542 translates displacement dX into a force on the resonator 540 which is then measured in a manner describe above. The magnitude of the force on resonator 540 may be adjusted by selecting the desired spring constant K for spring 542. The spring with an appropriate spring constant for translating a displacement dX into a desired force may be selected in a conventional manner. The mirror/photocell 546 performs the same function as element 518 of FIG. 10.

The following table summarizes applications of the open and closed-end tuning fork type transducers discussed thus far:

| APPLICATION | TYPES OF TRANSDUCERS |
| --- | --- |
| Pressure | open-end, closed-end tuning forks |
| Temperature | open-end, closed-end tuning forks |
| Force | closed-end tuning fork |
| Displacement(strain) | closed-end tuning fork with a spring |
| Acceleration | closed-end tuning fork with a mass |
| Chemical | open-end, closed-end tuning forks |
| Particulate/micro-mass balance | open-end, closed-end tuning forks |

FIGS. 12A through 12E are schematic views illustrating how the optical sensors of this invention may be used for measuring still other physical parameters. Such applications are alike in that the physical parameter is first converted into a representative electrical signal which is then applied to a piezoelectric or ferroelectric crystal to vibrate the crystal. The vibrations of the crystal are then optically detected to measure the physical parameter. All the open and closed-end tuning fork type transducers described above may be used for measuring physical parameters in such manner. Since the driving energy for vibrating the crystal transducer originates from the physical parameter or variable to be measured itself, the photo cell which has been used in previous embodiments is no longer needed for vibrating the crystal.

FIG. 12A is a schematic view of a portion of a transducer system for measuring a light signal. The light signal 550 is directed towards a photo detector 552 which generates a voltage representative of the light signal 550. The voltage signal across terminals A, B is then applied to the driving electrodes of the open and closed end tuning fork transducers of the above-described embodiments for measuring the AC component of the light signal.

FIG. 12B is a schematic view of a portion of a transducer arrangement for measuring electromagnetic or radiation signals. As shown in FIG. 12B the electromagnetic or radiation signal 554 is directed toward a conversion screen 556 which converts the signal into a light signal by means of luminescence that is detected by photodetector 558 which, in turn, generates a voltage signal across terminals A, B. The voltage signal is then again applied to the driving electrodes of the open and closed-end tuning fork transducers of the above described embodiments for measuring the signal. A number of phosphor and crystal based converter screens are available for converting either UV, visible, IR light, radiation or ionizing or X-ray radiation signals into light signals. The phosphor converter screen of the type manufactured by 3M Company under the tradename Trimax ® can be used for detecting X-rays. Many other known fluorescent materials may be used. The proper material may be selected depending on the particular signal to be measured.

FIG. 12C is a schematic view of a portion of a transducer system for measuring an electrical signal. The varying electrical signal 560 may be applied directly to drive the open and closed-end tuning fork type transducers described above. However, a DC blocking capacitor 562 may be used to block the DC component of the signal 560 if the DC component is too great for quartz crystals. Capacitor 562 may also be used as a transducer if the amplitude of electrical signal 560 is maintained constant. The capacitance of the capacitor may be changed by mechanically tuning the capacitor or by the influence of a varying physical parameter such as temperature, pressure or acoustic waves. This then causes a changing voltage potential on terminals A and B which can be detected optically using the optical sensors of this application.

FIG. 12D is a schematic view of a portion of a transducer system for measuring a varying magnetic field. As shown in FIG. 12D a magnetic transducer such as a coil of wire 564 is placed in the presence of the changing magnetic field 566. The changing magnetic field generates a voltage signal across the terminals A, B which is used to drive the tuning fork transducers for detecting the magnetic signal 566.

FIG. 12E is a schematic view of a portion of a transducer system for measuring a force. Force 568 is applied to a piezoelectric force transducer 570 causing the transducer to produce a voltage signal across terminals A and B which is used to drive the tuning fork type transducers described above in reference to FIGS. 1–11 to measure such force.

In the above description of optical sensors and their applications in reference to FIGS. 1 through 11, the transducers are vibrated by the light from a light source and a feedback system. The physical parameter to be measured modulates the vibrations of the transducers. The physical parameter is then measured by measuring such modulations. The physical parameter may be measured by measuring the amplitude, frequency or phase of the modulations of the tuning fork vibrations.

In the transducer systems and application described in reference to FIG. 12A through FIG. 12E the physical parameter to be measured is first converted into an electrical signal which is then used to move the tuning fork transducers. No separate light source or photo cell is used to vibrate the transducers. Thus, if the physical parameter to be measured does not vary (a constant magnetic field, for instance, cannot be measured by the system of FIG. 12D), then the tuning fork does not modulate at or below its resonance frequency. Instead the tines or bars of the tuning fork move apart or closer to each other in response to the electrical voltage. Such displacement is measured for measuring the physical parameter.

Described below are still other embodiments employing quartz crystals where the crystals are not separately vibrated by a light source and the photo cell as in the embodiments described in reference to FIGS. 1 through 11. Instead, the crystals respond to the physical parameter to be measured directly It will be understood that, while the embodiments below are described as quartz crystal transducers, other transducers made of other materials may be used as long as such transducers can bend or flex under the influence of physical parameters. All such configurations are within the scope of this invention.

One such transducer is shown in FIG. 13A which is a cross-sectional view of a transducer to illustrate another alternative embodiment of the optical transducers of this invention. As shown in FIG. 13A transducer 600 comprises a quartz crystal essentially having the same shape as crystal 500 of FIG. 10. The two bars or beams 604, 606, in addition to shutters 608 and 610 extending into the gap between arms 612 and 614, has two fingers 622 and 624 on the sides of bars 604, 606 opposite to the shutters. The two fingers 622 and 624 are each in contact with a respective diaphragm 626 and 628. The two diaphragms are mounted on frame members 630 and 632 attached to the crystal 602. The two diaphragms can be the same or be physically different from each other. Optical fiber 634 passes through a hole in member 632 for transmitting the modulated light signal from crystal 602. Light is supplied to crystal 602 through fiber 634 from a light source (not shown). The light supplied passes through arms 614, 612 is reflected by mirror 636 and retraces its path to fiber 634 which transmits the reflected light to a photo detector (not shown). The physical parameter to be measured such as force, pressure, displacement and acoustic waves may be applied to the two diaphragms 626 and 628. Since the two fingers 622 and 624 are connected to the two diaphragms, movement of the diaphragms will cause the light reflected by the mirror and transmitted by the optical fiber to a photo detector to be amplitude modulated because of the shutters 608, 610. If a mass is attached onto one of the two diaphragms, acceleration of the mass in a direction transverse to the diaphragm would deflect the shutter and modulate the light detected by the photo detector. Thus, transducer 600 can also be used as an accelerometer.

FIG. 13B is a cross-sectional view of yet another quartz tuning fork type transducer illustrating still another alternative embodiment of the optical transducer of this invention. As shown in FIG. 13B, transducer 650 comprises a tuning fork crystal 652 which is essentially the same as crystal 150 of FIG. 3A except for the fact that crystal 652 is slightly different in shape compared to crystal 150 and that crystal has two extra fingers 622, 624. Comparing FIGS. 13A and 13B, transducer 650 of FIG. 13B is identical to transducer 600 of FIG. 13A except that a different shaped crystal 652 is used instead of crystal 602 of FIG. 13A. The parts that are identical functionally in the two figures are denoted by the same numerals. In a manner similar to that described for transducer 600 above, transducer 650 of FIG. 13B may be used to measure pressure, force, displacement, acceleration and acoustic waves. Transducer embodiments of FIGS. 1, 2A, 4, 5A may be similarly modified and used instead of crystal 652 in FIG. 13B. All such configurations are within the scope of this invention.

FIG. 14A is a perspective view of an optical transducer illustrating an alternative embodiment of the optical transducer of this invention. The optical transducer 700 comprises a quartz crystal 702 having a central tine 704 surrounded by a frame 706. Tapering of the crystal at one end causes the central tine and the surrounding frame to become very thin at their apex. Such tapering can also be seen from the partial cross-sectional view of crystal 702 in FIG. 14B. Optical fiber 710 supplies light to crystal 702 which is reflected from mirror 712 to be received back by fiber 710. A thick metal film weight 714 plated on the end of the central tine increases the moment of inertia of the central tine relative to the surrounding tine for detecting acceleration. Movements in the direction depicted by 716 causes relative displacement between the central tine and its frame thereby also causing optical modulation of the light beam reflected back towards fiber 710.

The central tine can also be connected through an elongated member such as rod 718 to a suitably mounted diaphragm 720. The physical parameter to be measured such as pressure, force, displacement or acoustic waves cause diaphragm 720 to move. Motion of the diaphragm is transmitted by rod 718 causing relative motion between the central tine and its frame thereby also modulating the light transmitted back towards fiber 710. The physical parameter can then be measured. Again by putting a mass in contact with diaphragm 720, acceleration of the mass can be measured in the same manner.

FIG. 15 is a simplified schematic view of a transducer system where the transducer element is partially cut away and shown in perspective to illustrate another alternative embodiment of the optical transducer of this invention. The transducer system 800 comprises a sensing unit 802. Unit 802 includes a housing 804 with two windows 806 and 808. Housing 804 contains a tuning fork sensor 810. Tuning fork 810 may either be the open or closed-end type operating in the flexure, torsional or perpendicular vibrating modes. The sensing unit 802 may be used to sense any of the physical parameters discussed above in reference to other embodiments. The inside surface 812 of housing 804 can be either light absorbing or light reflecting depending upon the particular vibration or mode of the tuning fork. The source 820 directs the laser 822 towards tuning fork 810. Laser beam 822 is either reflected or modulated by the tuning fork and the reflected or modulated light 824 is eventually received by a detecting system 830 for measuring the physical parameter modulating the vibrations of the tuning fork 810. The manner in which light beam 822 is modulated by the vibrations of tuning fork 810 resulting in the modulated light beam 824 is described below in reference to FIGS. 16A, 16B and 16C.

Part of the laser beam 822 also enters window 808 and impinges on photo cell 832. Cell 832 provides electrical energy to drive an integrated oscillator 834 which in turn electrically drives tuning fork 810.

The advantage of the transducer system of FIG. 15 is that a number of transducer elements may be placed at scattered and otherwise unaccessible locations, where such elements are interrogated by laser beams. No optical fibers or connections other than laser beams are necessary so that the system can be made and operated at low cost.

FIGS. 16A, 16B and 16C are schematic views of the tines 842, 844 of tuning fork 810 illustrating the different ways in which the vibration of the tuning fork modulates the light beam 822. As shown in FIG. 16A, tuning fork 810 may vibrate in a torsional mode. The front surface of the two tines are coated with a light reflective material so that light beam 822 will be reflected into beams 824 at an angle to beam 822. In such instance, inside surface 812 of FIG. 15 is light absorbent. Detection system 830 then detects the frequency or amount of rotation of the tines for measuring the physical parameter which modulates the vibrations of the tuning fork. In FIG. 16B the two tines vibrate in the flexural mode. The front surface of the two tines are coated with a light absorbent material. A mirror or retro-reflecting element 846 is placed behind the tines. Light beam 822 is then reflected by mirror 846 along its incoming path.

The flexural vibrations of the tines modulates the amount of light reflected by mirror 846. The physical parameter to be measured modulates the vibrations of the tines. Therefore, measurement of the modulations of beam 824 indicates the phase, frequency or amplitude of the physical parameter. In FIG. 16C the front surface of the two tines are coated with a light reflective material. The two tines, however, are placed between a light absorbent screen 850 with an aperture therein so that when the tines vibrate the reflective area of the tines covered by screen 850 is modulated. In such manner vibrations of the tines modulates the intensity of the reflected beam 824

FIGS. 17A-22 are directed to embodiments for measuring electromagnetic parameters such as current, magnetic field or voltage by means of resonators which are connected to a body sensitive to the electromagnetic parameter. The parameter causes the body to change its dimension along a particular direction. The body is connected to the resonator in such manner that when the body is caused to change in dimension by the parameter, the body applies a force to the resonator thereby changing the resonance frequency of the resonator. The change in resonance frequency of the resonator is then detected to detect and measure the parameter. The resonating optical transducers described above are particularly advantageous for use in measuring the electromagnetic parameter. As indicated above, such optical transducers and the optical systems for resonating and interrogating the transducers are not affected by high electrical voltage or magnetic fields; for this reason, such transducers maintain their high accuracy even when placed in strong magnetic fields or subjected to high voltages. As a result they can be used in measuring current in high voltage transmission cables as well as precision measurements of voltage differences at these high voltage potentials. In many optical transducer embodiments described above, the transducers are resonated by means of voltages applied to the transducer where the voltage is generated from optical power supplied by fiberoptic cables. The electrically insulating fiberoptic cables permit the measurement in high voltage environments. While in most of the embodiments described above, fiberoptic cables are used to supply the optical power for resonating the transducers, the laser beam system shown in FIGS. 15-16C can also be employed in this high voltage application to remotely power and interrogate the sensors. In this particular embodiment, instead of supplying the optical power through fiberoptic cables, a laser beam is directed directly at the sensors without going through a fiberoptic cable to remotely power and interrogate the transducer. Since a variety of configurations may be used for the optical transducer, in the description below in reference to FIGS. 17A-22, the optical transducer will be represented simply by a box connected to one or two optical fibers. Of course, where a laser beam is used to power and interrogate the transducer, no optical fibers are required in FIGS. 17A-22, it being understood that such optical systems may also be used in FIGS. 17A-22.

FIG. 17A is a perspective view of an optical transducer for measuring magnetic fields A force sensing optical transducer 860 (such as transducer 450, 452 of FIG. 9A, transducer 500 of FIG. 10, or transducer 540 of FIG. 11) is attached at each end to a block of magnetostrictive body 862 by the bonding layer 864. If the transducers of FIG. 9A, 10, 11 are used, only one optical fiber is used to both optically power the vibrations of resonator 860 and also to detect the modulations of the intensity of the light caused by the resonance of the resonator 860. If other embodiments of the optical transducer (such as that of FIG. 1) is used, two optical fibers 866, 868 are used, one to power the resonator and another to optically interrogate the modulations of the vibrations of the resonator. For simplicity only one optical fiber is shown in the later figures, FIG. 18A-22. In other embodiments of the optical transducer (such as that of FIG. 15) no optical fibers are required, rather a laser beam is used as discussed above.

The magnetostrictive body 862 changes its length in response to the magnetic field 870 in a direction of the field 870. Since body 862 is bonded to resonator 860, this change in length causes a force to be applied to the resonator 860, thereby causing a change in its resonance frequency. The change in resonance frequency is detected as described above in reference to the numerous optical transducer embodiments in order to detect and measure the magnetic field 870.

Magnetostriction can be described as a change in the dimension of a ferromagnetic material along the axis of an applied magnetic field. Typically ferro-magnetic materials are crystalline metals and metallic glasses such as Fe, Co, and Ni along with their various alloys. Metallic glasses such as alloys 2605SC and 2605CO based upon the FeBSi system are also commercially available. In certain applications, it may be desirable to bond body 862 to a sheet of another material 862' (shown in dotted lines) which is not magnetostrictive. Thus, when body 862 changes in length in response to magnetic field 870, sheet 862' does not; this causes the block comprising body 862 and sheet 862' to bend. The bending also causes resonator 860 to change its length and alters its resonance frequency. The modulation of the resonance frequency is detected as before for detecting the magnetic field 870. Since the resonance element 860 can be made quite stiff changes in the actual axial forces changes its length very little.

FIG. 17B is a perspective view of an optical transducer for measuring a voltage potential V. As shown in FIG. 17B, body 862" is made of a piezoelectric instead of magnetostrictive material. Thus a voltage potential V applied across body 862" will cause the body to change in length in a manner which is well known to those skilled in the art. This causes a force to be applied to resonator 860 to modulate its resonance frequency. The modulations of resonance frequency is detected as before for measuring the electrical potential V. Body 862" may also be attached to a sheet of different material causing it to bend when the voltage V is applied. Such bending again modulates the frequency of resonator 860 and such modulations can be detected for measuring voltage V.

FIG. 18A is a bottom elevational view of a cylindrically configured optical transducer, an endless electrical conductor forming two loops, and a conductor carrying a current to illustrate how the invention can be employed for measuring current. As shown in FIG. 18A, a current 894 is carried by a conductor 896, a section of which is shown in FIG. 18A. An endless conductor 898 forms two loops 900 and 902. Loop 902 surrounds conductor 896. Current 894 induces a current in conductor 898 which in turn causes a local magnetic field within coil 900. The local magnetic field in coil 900 is measured by a transducer comprising resonator 880 and an optical transducer assembly 882. The transducer may, for example, be of a configuration similar to that in FIG. 17A. The transducer shown in FIG. 18A, however, is different from that of FIG. 17A and is shown more clearly in FIG. 18B which is a cross-sectional view of the transducer. As shown in FIGS. 18A, 18B, the transducer comprises a force sensing optical resonator 880 mounted within a transducer assembly 882. The assembly comprises two end caps 886, 888 attached to the two ends of the elongated resonator 880. The two end caps are connected to an annular member which includes two annular sections 890, 892. Section 892 is a magnetostrictive element which changes length in response to the local magnetic field inside coil 900. Such change in length causes the two end caps 886, 888 to move closer together or further apart, thereby applying a force on resonator 880 to change the resonance frequency. Such change in resonance frequency is interrogated through fiber 884 as before for detecting the magnetic field inside coil 900 and indirectly to detect and measure the current 894 carried by conductor 896.

Resonator 880, magnetostrictive annular section 892 as well as end caps 886, 888 all will expand and contract as a function of temperature. If the coefficient of thermal expansion of these materials are such as to cause a force to be applied to the resonator 880 as a result of thermal expansion and contraction, such force will also cause the resonance frequency of resonator 880 to change irrespective of the current 894. This causes inaccuracies in the measurement. It is desirable therefore to reduce or eliminate such inaccuracies caused by thermal expansion or contraction. For such purpose a temperature compensating annular section 890 is employed. As shown in FIG. 18A, sections 890, 892 are connected together and are each connected to end caps 886 and 888. Sections 890, 892 form an annular member attached to the two end caps. Section 890 is selected such that the thermal expansion of the annular member comprising both sections matches that of the resonator within a wide range of temperatures and such that the change in resonance frequency of the resonator is the same as if the resonator is not attracted to anything. The thermal expansion of this annular member can also be selected to compensator for the change in resonance frequency of the resonator in response to change in temperature. For example, if the resonance frequency of the resonator decreases slightly with increasing temperature, then the annular member can be constructed to have a thermal expansion slightly greater than that of the resonator. This would have the effect of slightly pulling or increasing the length of the resonator thereby increasing the resonator's resonance frequency. The net result is a transducer whose resonance frequency does not change with temperature.

Since the annular member is composed of two components, namely, the magnetostrictive (or piezoelectric) annular member and a temperature compensating annular member, the temperature compensation annular member would also offset the thermal expansion of the magnetostrictive (or piezoelectric) member. For example, if the resonator were made of quartz and the magnetostrictive material of nickel (whose thermal expansion is greater than that of quartz for the same temperature increase), then the temperature compensating member should have a thermal expansion which is less than that of quartz. Resonator 880 and assembly 882 together may of course be used simply for detecting and measuring a magnetic field.

An advantage of the transducers of FIGS. 17A-22 is that the resonator will provide a signal even when no current or magnetic field or voltage is present for detection. This is very different from certain prior art systems where no signal is provided when the electromagnetic parameter to be measured is zero or absent. Hence when no signal is provided, an operator of the prior art transducer systems will have to find out whether the lack of a signal is caused by a malfunction or simply the absence of the parameter to be measured. The cylindrical shape of optical transducer assembly 882 allows it and coil 900 to be placed inside an electromagnetic shielding enclosure (903) to reduce the effects of the electromagnetic field surrounding conductor 896 on the transducer (880,882).

In a manner similar to FIGS. 17A, 17B the magnetostrictive section 892 may be replaced with a piezoelectric section so that resonator 880 and assembly 882 may be used for measuring electrical potentials instead.

FIG. 19 is a perspective view of a hinged, lever armed transducer, which includes a magnetostrictive (piezoelectric) element and temperature compensating element, used for applying for to an optical force resonator for the purpose of measuring an electromagnetic parameter. The lever arm structure 912 comprises two arms 916a, 916b connected together by a hinge mechanism 918 at a point away from the ends of the two arms or members. The ends of the two members 916a, 916b on one side of the hinge mechanism are attached to the two ends of resonator 910. The two ends of the two members on the other side of the hinge mechanism are attached to a temperature compensating element 920 and a magnetostrictive element 922 where the two elements are connected in series. Element 922 changes in length in response to an applied magnetic field (not shown), thereby causing the ends of the members 916a, 916b to move closer together or further apart. Such movement causes a force to be applied to the resonator 910 through hinge 918, thereby changing its resonance frequency. The embodiment of FIG. 19 is advantageous for a variety of reasons. The amount of force applied to the resonator 910 by element 922 can be adjusted by choosing the location of hinge 918. Since element 922 is spaced apart from resonator 910, it is possible to shield (923) resonator 910 from the magnetic field. Since the change in length of element 922 affects resonator 910 only through the arms 916a, 916b, and the hinge 918, resonator 910 will not be caused to bend or twist sideways by the change in length in element 922. In such manner hinge 918 ensures that the force applied to the resonator 910 is restricted to one in the direction along the length of the resonator. The transducer of FIG. 19 may also be used for measuring current in the configuration of FIG. 18A by substituting transducer 880, assembly 882 with the transducer of FIG. 19A. When the magnetostrictive element 922 is replaced by a piezoelectric element, the transducer of FIG. 19 may be used for measuring voltage differences.

The location of hinge 918 can be selected to vary the operating range of the transducer. Furthermore, mass of lever arms 916a, 916b can be balanced about the hinge to reduce the sensitivity of the transducer to linear and rotational acceleration. The lever arm structure 912 can be constructed from a single piece of high strength metal, quartz, glassy-ceramics or ceramic material.

FIG. 20 is a perspective view of an alternative embodiment of a hinged, lever arm transducer which includes a pair of electrically conductive capacitor plates for loading the optical force resonator for measuring a voltage difference applied across the capacitor plates. A hinged, lever arm structure 932 is similar to structure 912 of FIG. 19 except that instead of employing a magnetostrictive element 922 and a temperature compensating element 920, two capacitor plates 934, 936 are attached to the two ends of the lever arms or members 916a, 916b. When desired, the ends of the two lever arms adjacent to the capacitor plates may include rectangular sections as shown in FIG. 20 to reduce the gap 938 between the capacitor plates. The gap 938 may be filled with air or other electrically insulating and resilient dielectric material. If a stiff dielectric material is used and is bonded to the two capacitor plates, the operating range of the transducer is increased since the strain in such material will offset a part of the attractive or repulsive force across the capacitor plates, thereby reducing the force on the resonator. However, when such stiff dielectric material is used, temperature compensation may be required so that a temperature compensation block of material may be placed above plate 934 and/or below plate 936 in a manner similar to that shown in FIG. 19 and the accompanying description.

In reference to FIGS. 18A, 18B above, a current is detected by means of the magnetic field generated in the two loops 900, 902 of an endless electrical wire 898. Other methods and techniques of detecting and measuring current are illustrated in reference to FIGS. 21, 22. As shown in FIG. 21, a current is passed through a conductor 940 which is shown in cross-section in FIG. 21. Four optical transducers of any one of the types shown in FIGS. 17A-19 may be used. Thus, as shown in FIG. 21 four transducers 942, 944, 946 and 948 are placed at locations radially around the conductor 940. The magnetic fields measured by the four transducers are then averaged to give a more accurate measurement of the current. Alternatively, and as shown in FIG. 22, a conductor 952 carrying current 954 is surrounded almost completely by a donut-shaped magnetic core 950 except for a small gap. The magnetic field between the gap, as illustrated by field lines 956, then averages the magnetic field surrounding the conductor 952. An optical resonance transducer 958 is placed in the gap for measuring the magnetic field in the gap. Such measurement then indicates accurately the current 954.

This invention is particularly advantageous for measuring current in high voltage transmission lines. The combined effect of the high Q of the resonators of this application and the high frequency resolution possible with modern frequency counting techniques for measuring the modulated light signal enables the current to be measured at high resolution. Short circuits may cause large transient current on the high voltage transmission lines causing overload conditions. Since the magnetostrictive material used in the transducers of FIGS. 17A-22 will saturate, the resonators employing magnetostrictive material will not be overloaded. In other words, if the magnetostrictive material used in the resonators saturates at a point where the strain on the material is still below the breaking strain, the resonator will not be overloaded. If the magnetostrictive material saturates at a strain close to the breaking strain, the change in dimension of the material may bear a non-linear relationship to the change in magnetic field and is undesirable. For this reason it may be desirable to choose a magnetostrictive material which saturates at only up to about 80% of the breaking strain.

Similarly, this invention is particularly advantageous for measuring high voltages in high voltage transmission lines. Again the voltage can be measured at high resolution and the piezoelectric material used saturates at high voltage conditions, thereby preventing overload of the resonator. Thus as long as the piezoelectric material saturates at a strain below the breaking strain, the resonator will not be overloaded at high voltage conditions. For reasons similar to those of resonators employing magnetostrictive material, it is desirable to employ resonators with piezoelectric material which saturates at a strain which is about 80% of the breaking strain or less.

The speed of response of the transducer is limited only by the time delay required for the resonator to change in dimension, which can occur in a fraction of a cycle. For this reason, the speed of response is not limited by the frequency (40,000 Hertz) typical of the resonators described herein, but by the ability of the monitoring electronics to detect a change in the expected slope of the modulated light signal (modulated by the resonance of the resonator) within each cycle. In view of the above described advantages, the transducers of this application have application in the high voltage current transformer metering and relaying fields. The embodiments of FIGS. 17A-22 may be used to detect and measure physical parameters which are not electromagnetic as well; such applications are within the scope of the invention.

The above-description of method and construction used is merely illustrative thereof and various changes in the materials combinations, shapes and sizes thereof are within the scope of the appended claims.

I claim:

1. A transducer apparatus for detecting a physical parameter comprising:
   a body that changes dimension in response to the parameter;
   a resonator adapted to vibrate mechanically at a resonance frequency, said resonator connected to said body so that when said body changes dimension, said body applies a force on said resonator or causes the resonator to change dimension, thereby modulating the resonance frequency of the resonator;
   means for supplying light to the resonator to resonate the resonator; and
   means for optically detecting modulations of the resonance frequency of the resonator caused by the force applied by the body to detect said parameter.

2. The transducer apparatus of claim 1, wherein said physical parameter is an electromagnetic parameter.

3. The transducer apparatus of claim 1, wherein said parameter is a changing or substantially constant electric field, magnetic field, voltage or current.

4. The transducer apparatus of claim 1, said apparatus further comprising means for shielding the resonator and body from any electromagnetic noise.

5. The transducer apparatus of claim 1, wherein said resonator is bonded to the body by a bonding material.

6. The transducer apparatus of claim 1, wherein said resonator reflects light, and wherein said detecting means comprises:
   means for supplying light to the resonator so that the light supplied is reflected by the resonator, and so that the modulations of the resonance of the resonator also modulates the intensity of the light reflected by the resonator;
   wherein the detecting means detects the modulations of the intensity of the light reflected by the resonator.

7. The transducer apparatus of claim 1, wherein said resonator absorbs light, and wherein said detecting means comprises:
   means for supplying light to the resonator so that the light supplied is absorbed by the resonator, and so that the modulations of the resonance of the resonator also modulates the intensity of the light absorbed by the resonator;
   wherein the detecting means detects the modulations of the intensity of the light absorbed by the resonator.

8. The apparatus of claim 1, wherein said parameter is a voltage, and wherein said body includes two capacitive plates spaced apart from each other, so that when said voltage is applied across the plates, the distance between the plates changes, causing either a force to be applied to the resonator or causing the resonator to change in dimension.

9. The transducer apparatus of claim 1, wherein said resonator has two ends, said body comprising:
   two end caps each attached to an end of the resonator; and
   an annular member connecting the two end caps, said annular member having an axis and changing in dimension along its axis when subjected to the parameter.

10. The transducer apparatus of claim 1, wherein said resonator transmits light, and wherein said detecting means comprises:
    means for supplying light to the resonator so that the light supplied is transmitted through the resonator, and so that the modulations of the resonance of the resonator also modulates the intensity of the light transmitted by the resonator;
    wherein the detecting means detects the modulations of the intensity of the light transmitted by the resonator.

11. The transducer apparatus of claim 1, wherein said parameter is a magnetic field, said body comprising a magnetostrictive material so that when the body is placed in a magnetic field, the body changes in dimension.

12. The transducer apparatus of claim 1, wherein said parameter is a voltage, said body comprising a piezoelectric material so that when a voltage is applied across the body, the body changes its dimension.

13. The transducer apparatus of claim 1, wherein said parameter is a current, said apparatus further comprising means responsive to the current for providing a magnetic field which is a function of the current wherein said body comprises a magnetostrictive material so that when the body is placed in the magnetic field, the body changes in dimension.

14. The apparatus of claim 1, wherein said body includes a portion that is spaced apart from the resonator and that changes in dimension when subjected to the parameter, and wherein said change in dimension of the portion causes a force to be applied to the resonator, or causes the resonator to change in dimension.

15. The transducer apparatus of claim 9, said annular member comprising a first annular section which changes in dimension along the axis of the member in response to the parameter, and a second annular section whose coefficient of thermal expansion is such that the thermal expansion of the annular member matches or compensates for that of the resonator in the direction along the axis of the member.

16. The transducer apparatus of claim 10, wherein said resonator is a tuning fork type transducer.

17. The transducer apparatus of claim 16, wherein in said resonating means includes optical and electrical feedback means responsive to the light supplied by the light supplying means for applying a voltage to the resonator for resonating the resonator.

18. The transducer apparatus of claim 11, wherein said magnetostrictive material saturates in the magnetic field when the strain in the resonator is lower than its breaking strain so that the resonator is not overloaded when the body is subjected to large magnetic fields.

19. The transducer apparatus of claim 11, wherein said magnetostrictive material saturates in response to increasing magnetic fields when the strain in the resonator is less than about 80% of its breaking strain so that the change in resonance frequency of the resonator varies substantially linearly with the the magnetic field.

20. The transducer apparatus of claim 12, wherein said piezoelectric material saturates in response to increasing voltages when the strain in the resonator is lower than its breaking strain so that the resonator is not overloaded when the body is subjected to large voltages.

21. The transducer apparatus of claim 12, wherein said piezoelectric material saturates in response to increasing voltages when the strain in the resonator is less than about 80% of its breaking strain so that the change in resonance frequency of the resonator varies substantially linearly with the the magnetic field.

22. The transducer apparatus of claim 13, wherein said magnetic field providing means comprises a magnetically conducting magnetic core which completely surrounds a conductor carrying the current except for a gap, wherein the magnetic field is provided across the gap.

23. The transducer apparatus of claim 13, wherein said magnetic field providing means comprises an electrical conductor which forms a first loop around a conductor carrying the current and a second loop for providing the magnetic field inside the second loop.

24. The transducer apparatus of claim 23, said apparatus further comprising means for shielding the resonator, body and the second loop from any electromagnetic noise and the magnetic field caused by the current in the conductor and the current in the first loop.

25. The transducer apparatus of claim 14, wherein the parameter is a voltage, said portion of the body comprising two electrically conductive capacitive plates; and wherein said body further comprises:
    two levers connected at their fulcrums, said portion and said resonator being connected to the two levers such that, when the voltage is applied across the two plates, the two plates are urged further apart or closer together, thereby causing the two levers to move relative to each other about their fulcrums to apply a force on the resonator, or to cause the resonator to change in dimension.

26. THe apparatus of claim 14, wherein said resonator but not said portion is shielded from said parameter.

27. The transducer apparatus of claim 14, said resonator having two ends, said apparatus further comprising an assembly for connecting the resonator to the body, said assembly comprising:
    a first and a second lever connected at their fulcrums; said body and said resonator connected to the two levers such that when the body changes in dimension, it causes the two levers to move relative to each other at their fulcrums to apply a force to the resonator or causes the resonator to change in dimension.

28. The transducer apparatus of claim 27, wherein said portion of the body comprises a first element, and wherein said body further comprises a second element, wherein the first element is attached to the end of one member and the second element is attached to the end of the other member, and wherein said two elements are connected such that:

when the first element changes in dimension in response to the parameter along a first direction, it causes the two ends of the two members attached to the body to move closer together or further apart in the first direction, said movement of the members causing a force to be applied to the resonator or causing the resonator to change dimension along a second direction; and wherein the second element has a coefficient of thermal expansion which is such that the combined thermal expansion or contraction of the first and second elements in the first direction matches or compensates for that of the resonator in the second direction.

29. The transducer apparatus of claim 13, said apparatus further comprising means for shielding the resonator but not the body from the physical parameter.

30. A method for detecting an electromagnetic parameter by means of a body which changes in dimension when subjected to the parameter and a resonator connected to said body so that when said body changes dimension in response to the parameter, said body applies a force on said resonator or causes said resonator to change in dimension, thereby modulating the resonance frequency of the resonator, said method comprising:

supplying light to resonate the resonator; and
optically detecting modulations of the resonance frequency of the resonator as a result of change in dimension, caused by the body or caused by the force applied by the body, to detect said parameter.

31. The method of claim 30, wherein said resonator transmit light, and wherein said detecting step comprises:

supplying light to the resonator so that the light supplied is transmitted through the resonator, and so that the modulations of the resonance of the resonator also modulates the intensity of the light transmitted by the resonator;
wherein the detecting step detects the modulations of the intensity of the light transmitted by the resonator.

32. The method of claim 30, wherein the parameter detected is a current carried in a conductor, wherein the detecting step detects the magnetic fields at least two different points adjacent to the conductor.

33. A transducer apparatus for detecting an electrical signal comprising:

a piezoelectric member which transmits light;

means for applying the electrical signal to the member to vibrate the member;
means for supplying light to the member, so that the light transmitted by the member is in a direction transverse to the vibration of the member, wherein the vibration of said member modulates the light transmitted by the member; and
means for detecting modulations of the light transmitted by the member to detect said electrical signal.

34. The transducer of claim 33, wherein said modulations detecting means detects the frequency modulations of the light.

35. A transducer apparatus for detecting a physical parameter, wherein said parameter is a magnetic field, a current or a voltage, said apparatus comprising:

a body;
a resonator connected to said body, said body being such that when said body is subjected to the magnetic field, current or voltage, said body applies a force on said resonator thereby modulating the resonance frequency of the resonator;
means for resonating the resonator; and
means for detecting modulations of the resonance frequency of the resonator caused by the force applied by the body to detect said parameter.

36. A transducer apparatus for detecting a physical parameter comprising:

means for supplying light;
a piezoelectric resonator for altering the intensity of light supplied by the supplying means, wherein the resonance of the resonator alters the intensity of the light;
means for resonator the member piezoelectrically so that the physical parameter influences the resonance of the member; and
means responsive to the light intensity modulations for determining changes in the resonance frequency of the resonator in order to detect said physical parameter.

37. A transducer apparatus for detecting a physical parameter comprising:

a body that changes dimension in response to the parameter;
a resonator adapted to vibrate mechanically at a resonance frequency, said resonator connected to said body so that when said body changes dimension, said body applies a force on said resonator or causes the resonator to change dimension, thereby modulating the resonance frequency of the resonator;
means for resonating the resonator; and
means for detecting modulations of the resonance frequency of the resonator caused by the force applied by the body to detect said parameter.

38. The apparatus of claim 37, wherein said resonating means resonates the resonator optically.

39. The apparatus of claim 37, wherein said detecting means detects the modulations optically.

* * * * *

UNITED STATES PATENT AND TRADEMARK OFFICE
CERTIFICATE OF CORRECTION

PATENT NO. : 4,897,541

DATED : JANUARY 30, 1990

INVENTOR(S) : STEPHEN R. PHILLIPS

It is certified that error appears in the above-identified patent and that said Letters Patent is hereby corrected as shown below:

Column 28, line 59, in Claim 26:  replace "THe" with --The--

Column 29, line 25, in Claim 29:  replace "claim 13," with --claim 27,--

Signed and Sealed this

Twenty-sixth Day of June, 1990

Attest:

HARRY F. MANBECK, JR.

*Attesting Officer*  *Commissioner of Patents and Trademarks*

UNITED STATES PATENT AND TRADEMARK OFFICE
CERTIFICATE OF CORRECTION

PATENT NO. : 4,897,541

DATED : Jan. 30, 1990

INVENTOR(S) : Stephen R. Phillips

It is certified that error appears in the above-identified patent and that said Letters Patent is hereby corrected as shown below:

Drawing Sheet No. 20 consisting of Figures 21-22 should be added as per attached sheet.

The sheets of drawings Nos. 1-19 and consisting of Figures 1-20 should be relabeled to include the twentieth drawing sheet. (i.e. "Sheet 1 of 20", "Sheet 2 of 20", etc.)

Signed and Sealed this

Twenty-first Day of July, 1992

Attest:

DOUGLAS B. COMER

*Attesting Officer*　　*Acting Commissioner of Patents and Trademarks*

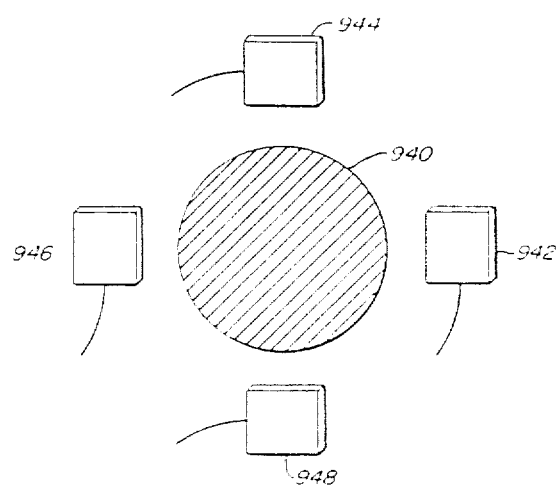
FIG._21.
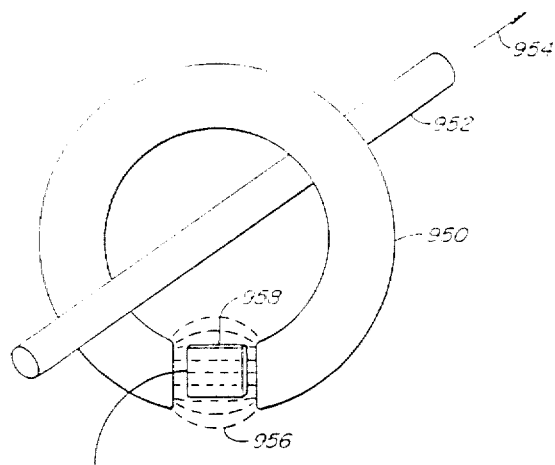
FIG._22.